(12) United States Patent
Hisamoto et al.

(10) Patent No.: US 10,854,730 B2
(45) Date of Patent: Dec. 1, 2020

(54) SEMICONDUCTOR DEVICE AND METHOD OF MANUFACTURING THEREOF

(71) Applicant: RENESAS ELECTRONICS CORPORATION, Tokyo (JP)

(72) Inventors: Digh Hisamoto, Tokyo (JP); Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/447,457

(22) Filed: Jun. 20, 2019

(65) Prior Publication Data

US 2020/0006526 A1  Jan. 2, 2020

(30) Foreign Application Priority Data

Jun. 28, 2018 (JP) .................. 2018-123268

(51) Int. Cl.
| | |
|---|---|
| *H01L 29/792* | (2006.01) |
| *H01L 29/66* | (2006.01) |
| *H01L 21/762* | (2006.01) |
| *H01L 21/311* | (2006.01) |
| *H01L 27/11565* | (2017.01) |
| *H01L 27/11568* | (2017.01) |
| *H01L 21/28* | (2006.01) |

(52) U.S. Cl.
CPC .. *H01L 29/66545* (2013.01); *H01L 21/31144* (2013.01); *H01L 21/762* (2013.01); *H01L 27/11565* (2013.01); *H01L 27/11568* (2013.01); *H01L 29/40117* (2019.08); *H01L 29/66795* (2013.01)

(58) Field of Classification Search
CPC ......... H01L 29/66545; H01L 29/40117; H01L 21/762; H01L 21/31144; H01L 27/11565; H01L 29/66795; H01L 27/11568; H01L 21/823431; H01L 27/0886
See application file for complete search history.

(56) References Cited

U.S. PATENT DOCUMENTS

| | | |
|---|---|---|
| 7,504,689 B2 | 3/2009 | Hisamoto et al. |
| 9,177,807 B2 | 11/2015 | Shinohara |
| 10,043,814 B2 | 8/2018 | Yamashita |

FOREIGN PATENT DOCUMENTS

| | | |
|---|---|---|
| JP | 2006-041354 A | 2/2006 |
| JP | 2014-127527 A | 7/2014 |
| JP | 2017-045860 A | 3/2017 |

*Primary Examiner* — Robert G Bachner

(74) *Attorney, Agent, or Firm* — McDermott Will & Emery LLP

(57) ABSTRACT

A part of the semiconductor substrate is processed to form fins protruding from the upper surface of the semiconductor substrate. Next, an interlayer insulating film is formed on the semiconductor substrate including the fin FA, and an opening is formed in the interlayer insulating film. Next, a dummy pattern including the dummy material and the insulating film is formed in the opening in a self-aligned manner. Thereafter, the dummy pattern is replaced with a memory gate electrode, a control gate electrode, and the like.

17 Claims, 30 Drawing Sheets

| APPLIED VOLTAGE<br>OPERATION | Vd | Vcg | Vmg | Vs | Vb |
|---|---|---|---|---|---|
| WRITE | 0V/Vcc | 0.5V | 10V | 5V | 0V |
| ERASE | 0V | 0V | −5V | 5V | 0V |
| READ | Vcc | Vcc | 0V | 0V | 0V |

Vcc = 1.5V

SEMICONDUCTOR DEVICE AND METHOD OF MANUFACTURING THEREOF

CROSS-REFERENCE TO RELATED APPLICATIONS

The disclosure of Japanese Patent Application No. 2018-123268 filed on Jun. 28, 2018 including the specification, drawings and abstract is incorporated herein by reference in its entirety.

BACKGROUND

The present invention relates to a semiconductor device and method of manufacturing thereof, and more particularly, to a technique effective for application to a semiconductor device including a fin structure transistor.

Flash memories or EEPROM (Electrically Erasable and Programmable Read Only Memory) are widely used as electrically writable and erasable nonvolatile memories. These storage devices have a conductive floating gate electrode or a trapping insulating film surrounded by an oxide film below the gate electrode of MISFET (Metal Insulator Semiconductor Field Effect Transistor), and the charge accumulation state in the floating gate or the trapping insulating film is used as storage information, which is read out as a threshold of the transistor. The trapping insulating film refers to an insulating film capable of accumulating charges, and as an example, a silicon nitride film or the like can be given. By shifting the threshold of the MISFET by injecting and discharging charges into/from the charge storage layers, the MISFET can be used as a nonvolatile memory. This flash memory is also referred to as a MONOS (Metal Oxide Nitride Oxide Semiconductor type transistor. In addition, split-gate memory cells in which a MONOS transistor is used as a memory transistor and a control transistor is further added are widely used.

In addition, a fin-structure transistor is known as a field-effect transistor capable of increasing an operation speed, reducing a leakage current and power consumption, and miniaturizing a semiconductor element. The fin-structure transistor (FinFET: Fin Field Effect Transistor) is, for example, a semiconductor element having a semiconductor layer protruding from a semiconductor substrate as a channel region, and having a gate electrode formed so as to stride over the semiconductor layer substrate protruded.

Japanese Unexamined Patent Application Publication No. 2006-41354 discloses a split-gate memory cell having a MONOS transistor.

Japanese Unexamined Patent Application Publication No. 2017-45860 discloses a technique of forming a MONOS transistor as a fin-structure transistor. A technique is disclosed in which a control gate electrode is formed by patterning, then a polycrystalline silicon film is formed so as to cover the control gate electrode, and anisotropic etching is performed on the polycrystalline silicon film to form a memory gate electrode in the shape of a sidewall spacer on the side surface of the control gate electrode.

Japanese Unexamined Patent Application Publication No. 2014-127527 discloses a split-gate memory cell having a MONOS transistor. A technique of forming a control gate electrode in a region where the dummy pattern is removed, that is, a technique called "gate last" is disclosed.

SUMMARY

In the fin structure transistor, many steps are generated by the fins protruding from the semiconductor substrate. Therefore, when a plurality of gate electrodes is formed as in a split gate type memory cell, an etching process having a high aspect ratio is required in some cases depending on the height of the fin, and it is difficult to form each gate electrode. In addition, there may be an isolated pattern having a fine gate length during the manufacturing process, but as the miniaturization of the semiconductor element progresses, it is important to suppress the collapse of such an isolated pattern.

Other objects and novel features will become apparent from the description of the specification and the accompanying drawings.

The typical ones of the embodiments disclosed in the present application will be briefly described as follows.

The method of manufacturing a semiconductor device according to the embodiment includes a step of preparing a semiconductor substrate, a step of forming a first interlayer insulating film on the semiconductor substrate, a step of forming a first opening in the first interlayer insulating film, a step of forming a dummy pattern in the first opening, a step of removing a part of the dummy pattern, and a step of filling the first opening from which the part of the dummy pattern is removed with the first gate electrode. The method of manufacturing a semiconductor device further includes a step of removing the dummy pattern left in the first opening, and a step of filling the first hole from which the dummy pattern is removed with the second gate electrode.

According to one embodiment, the yield of the semiconductor device can be improved.

BRIEF DESCRIPTION OF THE DRAWINGS

FIG. 21 and FIG. 20 are cross-sectional views illustrating a manufacturing process following FIGS. 19 and 20.

DETAILED DESCRIPTION

Figure 1:
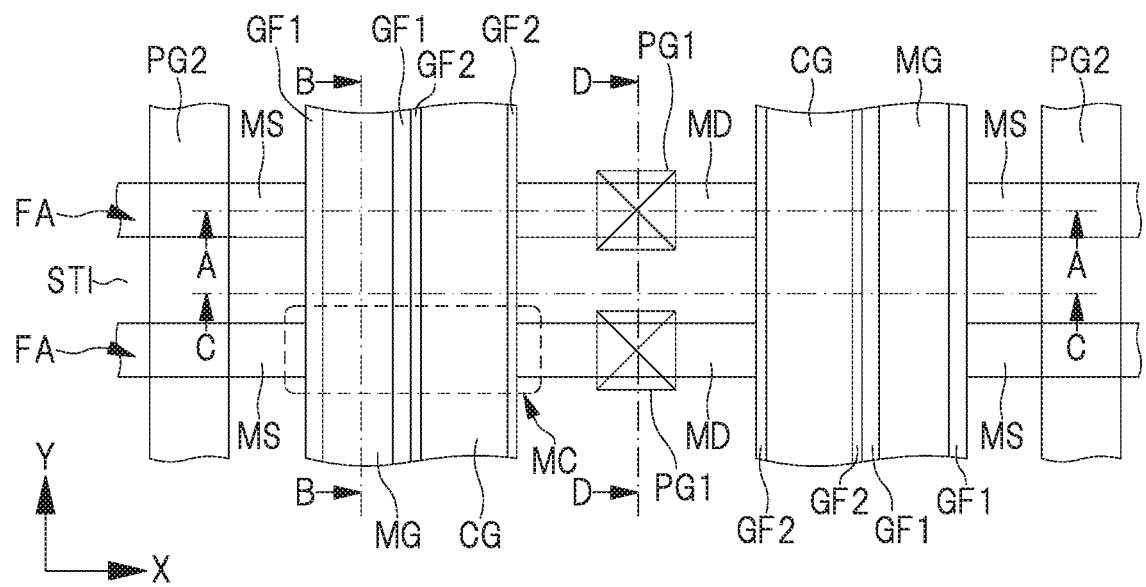
FIG. 1 is a plan view illustrating a semiconductor device according to the first embodiment.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modified examples, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Furthermore, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

First Embodiment

Figure 2:
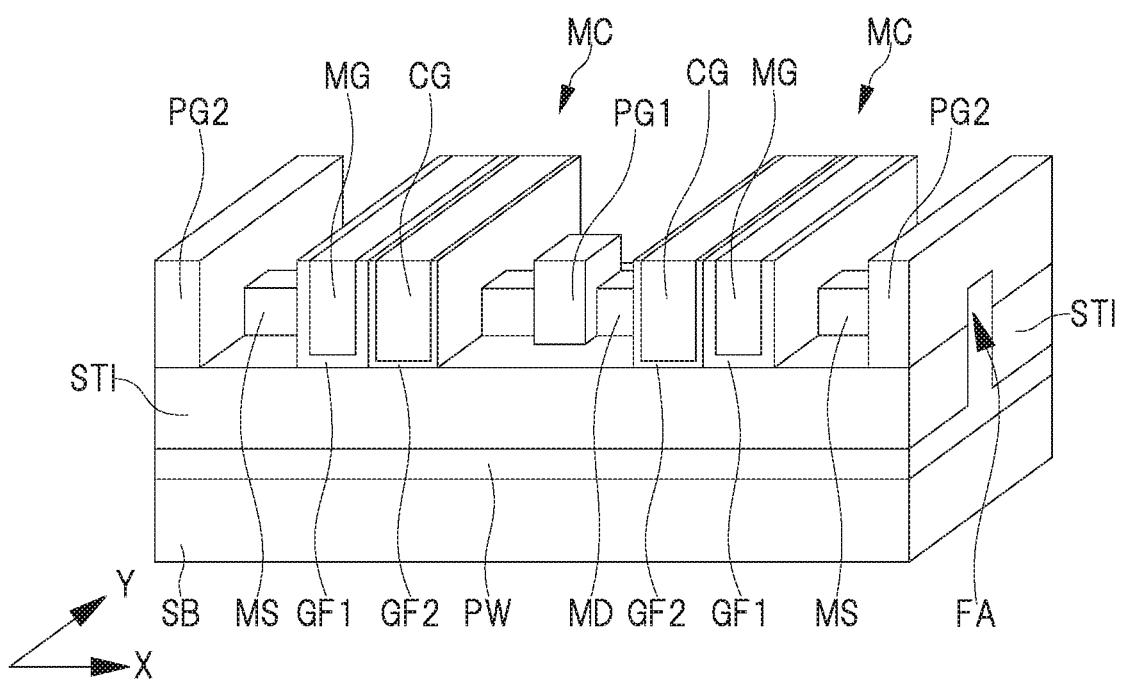
FIG. 2 is a perspective view illustrating a semiconductor device according to a first embodiment.
Figure 3:
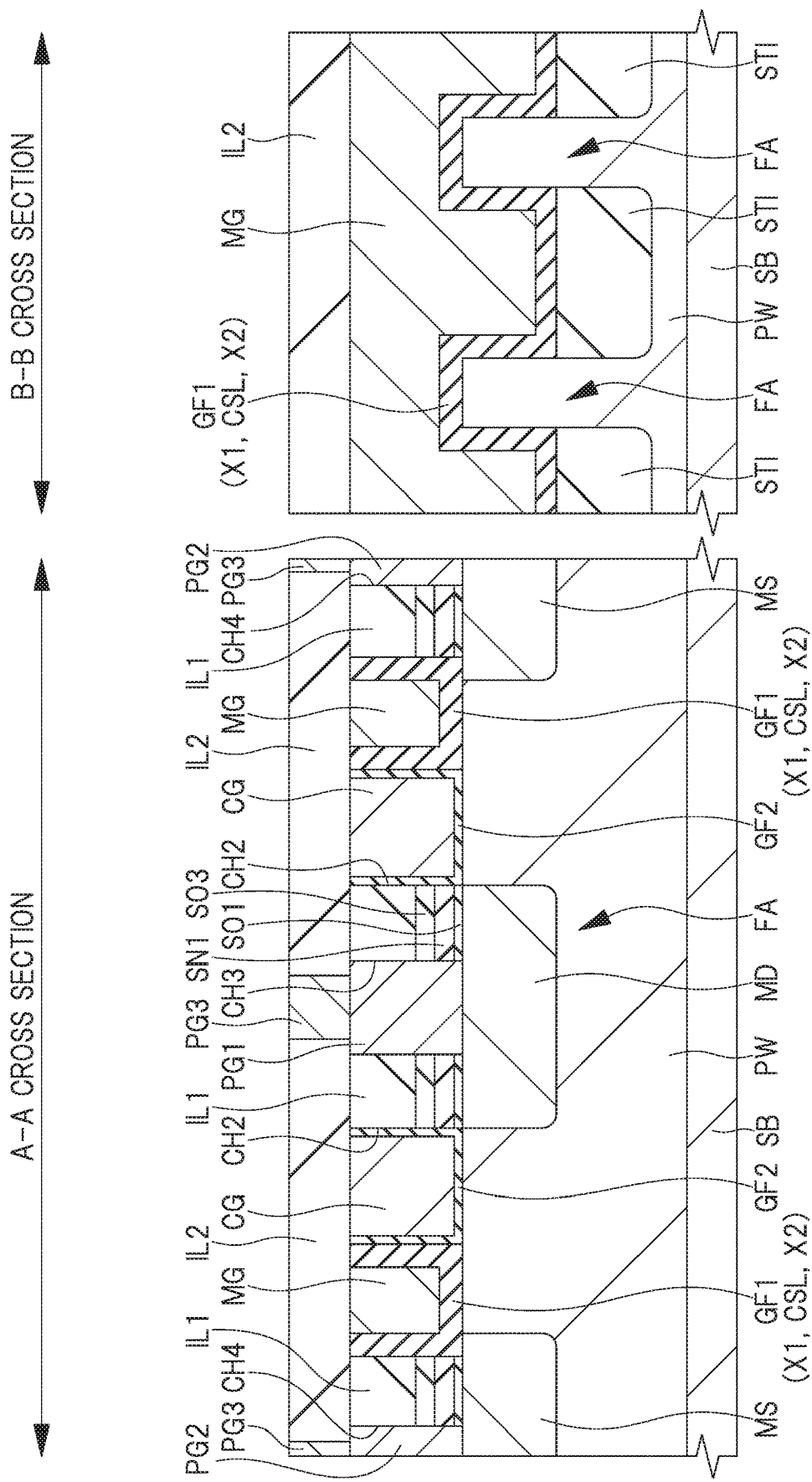
FIG. 3 is a cross-sectional view illustrating a semiconductor device according to the first embodiment.
Figure 4:
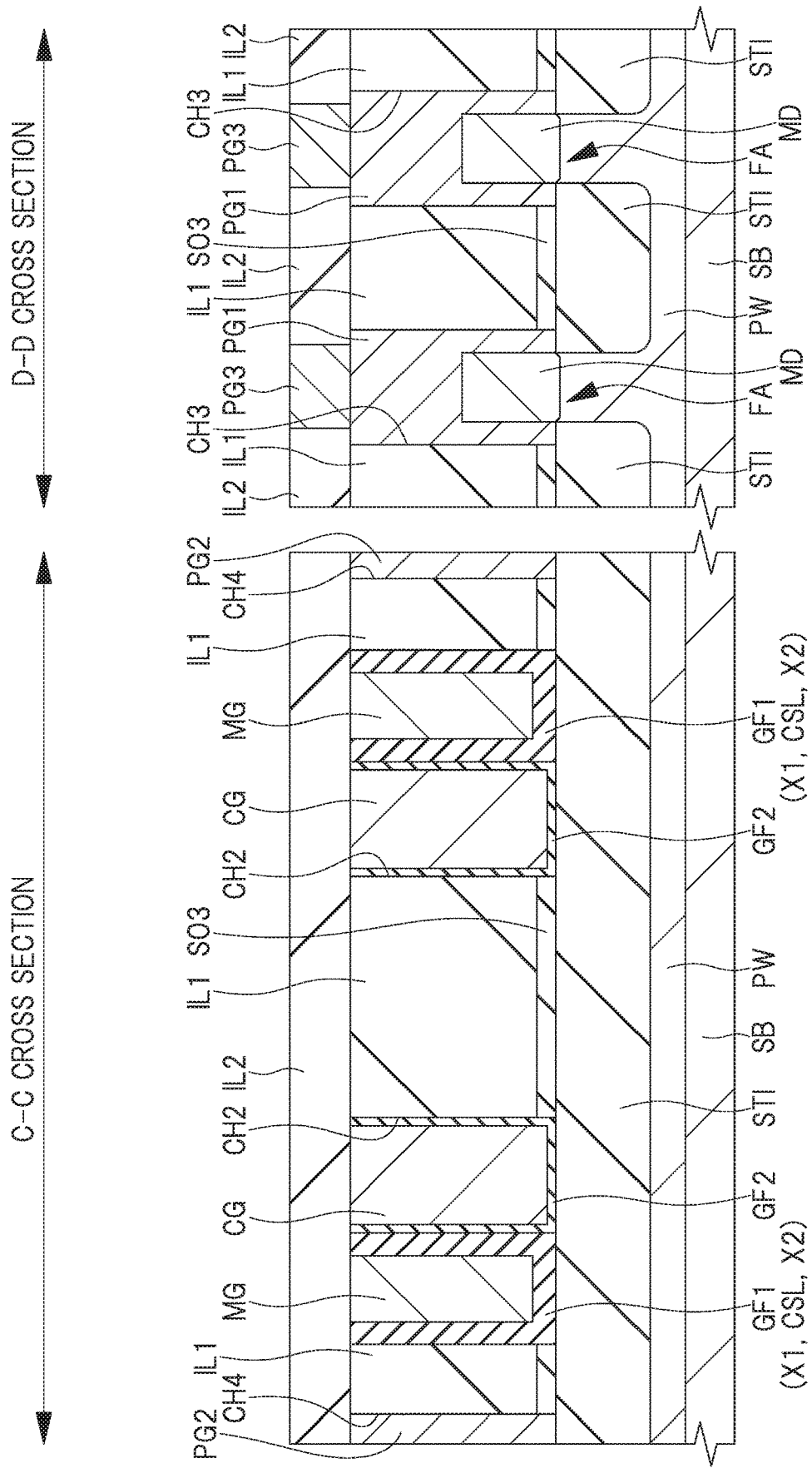
FIG. 4 is a cross-sectional view illustrating a semiconductor device according to the first embodiment.

A semiconductor device including a memory cell (non-volatile memory cell) MC of a transistor having a fin structure in this embodiment will be described with reference to the drawings. FIG. 1 is a plan view of a memory cell MC. FIG. 2 is a perspective view of the memory cell MC. FIG. 3 shows a cross-sectional view corresponding to line A-A and line B-B of FIG. 1, and FIG. 4 shows a cross-sectional view corresponding to line C-C and line D-D of FIG. 1.

Note that although the semiconductor device of this embodiment includes a logic circuit, an analogue circuit, a SRAM circuit, an input/output circuit, and the like in addition to the memory cell MC described above, the semiconductor device of this embodiment is characterized mainly by the memory cell MC, and therefore, detailed descriptions of other circuits are omitted.

Structure of Semiconductor Device

The structure of the memory cell MC of the present embodiment will be described below with reference to FIGS. 1 to 4.

An insulating film SO1, an insulating film SN1, an insulating film SO3, an interlayer insulating film IL1, an interlayer insulating film IL2, and a plug PG3 are formed on each memory cell MC as described later, but these are omitted in FIGS. 1 and 2 in order to show main parts of the memory cell MC in an easy-to-understand manner.

In plan view, a plurality of fins FA extending in the X direction are arranged on the semiconductor substrate SB at equal intervals in the Y direction. The X direction and the Y direction are directions along the main surface of the semiconductor substrate SB, and the X direction is orthogonal to the Y direction. The length of the fin FA in the X direction is longer than the length of the fin FA in the Y direction. That is, the X direction is the long side direction of the fin FA, and the Y direction is the short side direction of the fin FA. The fin FA is a part of the semiconductor substrate SB, and is a protrusion in the shape of a rectangular parallelepiped that selectively protrudes from the upper surface of the semiconductor substrate SB.

An element isolation portion STI is formed in the semiconductor substrate SB between the plurality of fins FA. The position of the upper surface of the element isolation portion STI is lower than the position of the upper surface of the fin FA. In other words, a part of the fin FA protrudes from the element isolation portion STI, and the other part of the fin FA is positioned so as to be sandwiched by the element isolation portion STI in the Y direction. As described above, the upper portion of each fin FA is insulated and isolated by the element isolation portion STI. In the present embodiment, the fin FA located higher than the upper surface of the element isolation portion STI may be referred to as the upper portion of the fin FA, and the fin FA located lower than the upper surface of the element isolation portion STI may be referred to as the lower portion of the fin FA.

The upper portion of the fin FA is mainly an active region for forming the memory cell MC. That is, in the semiconductor substrate SB, a region partitioned by the element isolation portion STI is an active region.

The fin FA does not necessarily have to be a rectangular parallelepiped, and the corners of the rectangle may be rounded when viewed in cross section in the Y direction. The side surface of the fin FA may be perpendicular to the main surface of the semiconductor substrate SB, or may have an inclination angle close to perpendicular to the main surface of the semiconductor substrate SB.

A plurality of memory gate electrodes MG and a plurality of control gate electrodes CG extending in the Y direction are arranged on the plurality of fins FA. The plurality of memory gate electrodes MG and the plurality of control gate electrodes CG are formed so as to cover the upper surface and the side surface of the fins FA via the gate insulating film GF1 and the gate insulating film GF2, respectively.

An n-type diffusion region MD is formed as a drain region in the fin FA on the control gate electrode CG side, and an n-type diffusion region MS is formed as a source region in the fin FA on the memory gate electrode MG side. The diffusion region MD and the diffusion region MS are formed so as to sandwich a channel region, which is a portion of the fin FA covered with the control gate electrode CG and the memory gate electrode MG, in the X direction. That is, in the X direction, one control gate electrode CG and one memory gate electrode MG are located between the diffusion region MS and the diffusion region MD.

The diffusion region MD is formed between two control gate electrodes CG adjacent to each other in the X direction, and the diffusion region MS is formed between two memory gate electrodes MG adjacent to each other in the X direction. As described above, the two memory cells MC adjacent in the X direction share the diffusion region MD or the diffusion region MS. Two memory cells MC sharing the diffusion region MD have line symmetry in the X direction with the diffusion region MD as an axis, and two memory cells MC sharing the diffusion region MS have line symmetry in the X direction with the diffusion region MS as an axis.

The memory cell MC of the present embodiment is a MISFET having a memory gate electrode MG, a gate insulating film GF1, a control gate electrode CG, a gate insulating film GF2, a diffusion region MD, and a diffusion region MS, and is a nonvolatile memory cell.

A plug PG1 is formed on the diffusion region MD, and a plug PG2 is formed on the diffusion region MS. The plug PG2 extends in the Y direction so as to commonly connect the diffusion regions MS of the memory cells MC adjacent to each other in the Y direction.

Hereinafter, the cross-sectional structure of the semiconductor device of the present embodiment will be described in detail with reference to FIGS. 3 and 4.

A well region PW, which is a semiconductor region having p-type conductivity, is formed in the semiconductor substrate SB including the fin FA.

The upper surface and the side surface of the fin FA are covered with an interlayer insulating film IL1. A opening CH2 is formed in the interlayer insulating film IL1, and a memory gate electrode MG is formed via the gate insulating film GF1 and a control gate electrode CG is formed via the gate insulating film GF2 so as to fill the opening CH2. That is, like the memory gate electrode MG and the control gate electrode CG, the opening CH2 extends in the Y direction shown in FIG. 1.

In the X direction, a gate insulating film GF1 and a gate insulating film GF2 exist between the memory gate electrode MG and the control gate electrode CG, and the control gate electrode CG and the memory gate electrode MG are electrically separated by the gate insulating film GF1 and the gate insulating film GF2. The gate insulating film GF1 is continuously formed so as to cover both side surfaces and the bottom surface of the memory gate electrode MG, and the gate insulating film GF2 is continuously formed so as to cover both side surfaces and the bottom surface of the control gate electrode CG.

The gate insulating film GF1 is formed on the upper surface of the fin FA so as to cover the upper surface and the side surface of the fin FA, and is also formed on the upper surface of the element isolation portion STI between two adjacent fins FA. Although not shown, the gate insulating film GF2 is also formed in the same manner as the gate insulating film GF1.

As described above, the memory gate electrode MG, the gate insulating film GF1, the control gate electrode CG, and the gate insulating film GF2 extend in the Y direction so as to extend over the plurality of memory cells MC.

In the present embodiment, the gate insulating film GF1 is formed of a laminated film including an insulating film X1, a charge storage layer CSL formed on the insulating film X1, and an insulating film X2 formed on the charge storage layer CSL.

The insulating film X1 is formed on the upper surface and the side surface of the fin FA, is an insulating film such as a silicon oxide film, for example, and has a thickness of about 2 to 4 nm.

The charge storage layer CSL is formed on the upper surface and the side surface of the fin FA via the insulating film X1, and is also formed on the upper surface of the element isolation portion STI between two adjacent fins FA. The charge storage layer CSL is a film provided for storing data of the memory cell MC, and is an insulating film having a trap level capable of holding charge. As the insulating film having such a trap level, for example, a silicon nitride film can be given. The thickness of the charge storage layer CSL is about 5 to 7 nm. As another material of the insulating film having the trapping level, for example, a metal oxide film containing hafnium (Hf) and silicon (Si), such as a hafnium silicate film (HfSiO film), can be used.

The insulating film X2 is formed on the upper surface and the side surface of the fin FA via the insulating film X1 and the charge storage layer CSL, and is, for example, a silicon oxide film or a metal oxide film such as an alumina film (AlO film), and has a thickness of about 5 to 7 nm. The insulating film X2 is a film provided to improve the dielectric strength between the charge storage layer CSL and the memory gate electrode MG.

In the present embodiment, the insulating film X1, the charge storage layer CSL, and the insulating film X2 are not shown in detail for the sake of clarity, and these laminated films are shown as the gate insulating film GF1.

The memory gate electrode MG is a conductive film formed on the upper surface and the side surface of the fin FA via the gate insulating film GF1. As such a conductive film, for example, a polycrystalline silicon film into which an n-type impurity is introduced can be used. Instead of the polycrystalline silicon film, the memory gate electrode MG may be a single-layer metal film made of tantalum nitride film, or of an aluminum film, or a laminated film in which these films are appropriately stacked. The gate insulating film GF2 is a so-called high dielectric constant film (High-k film) made of a metallic oxide film and having a dielectric constant higher than that of silicon oxide. The gate insulating film GF2 is an oxide film containing hafnium, such as a hafnium oxide film ($HfO_2$), and has a thickness of 1 nm to 2 nm. A silicon oxide film having a thickness of about 1 nm may be formed between the gate insulating film GF2 and the fin FA as an insulating film for stabilizing the interface state.

The control gate electrode CG is, for example, a single-layer metal film made of a tantalum nitride film, or of an aluminum film, or a laminated film in which these films are appropriately stacked.

An n-type diffusion region MD is formed as a drain region in the fin FA on the control gate electrode CG side, and an n-type diffusion region MS is formed as a source region in the fin FA on the memory gate electrode MG side.

On the diffusion region MD and the diffusion region MS, laminated films of an insulating film SO1, an insulating film SN1, an insulating film SO3, and an interlayer insulating film IL1 are formed. In the X direction, the laminated film are formed between the memory gate electrodes MG adjacent to each other and between the control gate electrodes CG adjacent to each other. The upper surface of the interlayer insulating film IL1 is polished by the Chemical Mechanical Polishing method. Therefore, the interlayer insulating film IL1 does not cover the entire memory cell MC, and the upper surface of the memory gate electrode MG, the upper surface of the control gate electrode CG, the upper portion of the gate insulating film GF1, and the upper portion of the gate insulating film GF2 are exposed from the interlayer insulating film IL1.

An opening CH3 and an opening CH4 are formed in the laminated film including the interlayer insulating film IL1. The plug PG1 connected to the diffusion region MD is filled inside the opening CH3, and the plug PG2 connected to the diffusion region MS is filled inside the opening CH4.

An interlayer insulating film IL2 is formed on the memory cell MC and the interlayer insulating film IL1, and a plurality of plugs PG3 are formed in the interlayer insulating film IL2. Although not illustrated, a wiring served as a bit line, a wiring served as a source line, a wiring for supplying an electric potential to the memory gate electrode MG, a wiring for supplying an electric potential to the control gate electrode CG, and the like are formed over the interlayer insulating film IL2. The plug PG1 is electrically connected to a wiring served as a bit line via the plug PG3, and the plug PG2 is electrically connected to a wiring served as a source line via the plug PG3. Although not shown here, the memory gate electrode MG and the control gate electrode CG are also connected to the above-mentioned wiring through the plug PG3. These wirings have a structure in which a conductive film mainly made of copper is filled in a trench for wiring, and are wirings having a so-called Damascene structure.

Operations of the Nonvolatile Memory

Next, an operation example of the nonvolatile memory cell will be described with reference to FIGS. 5 and 6.

Figures 5, 6:
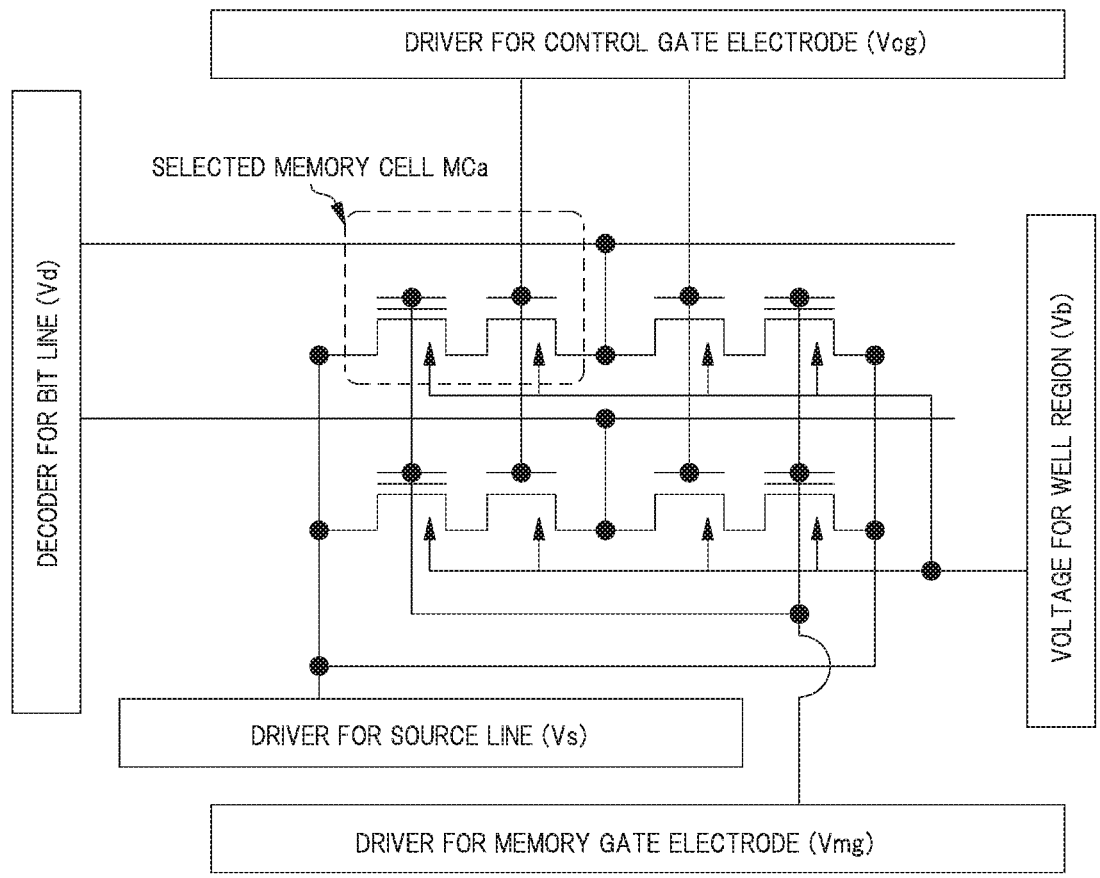
FIG. 5 is a diagram illustrating an example of a nonvolatile memory module.
FIG. 6 is a table illustrating an example of a condition for applying a voltage to each part of a selected memory cell during "write", "erase" and "read".

FIG. 5 shows an example of a nonvolatile memory module, and is an equivalent circuit diagram showing a connection relationship of four memory cells MC out of a plurality of memory cells MC. Each control gate electrode CG is electrically connected to a driver for a control gate electrode CG, each memory gate electrode MG is electrically connected to a driver for a memory gate electrode MG, each diffusion region MS as a source region is electrically connected to a driver for a source line, and each diffusion region MD as a drain region is electrically connected to a decoder for a bit line.

FIG. 6 is a table showing an example of application conditions of voltages to the respective portions of the selected memory cell MCa among the four memory cells MC shown in FIG. 5 at the time of "write", "erase" and "read". In the table of FIG. 6, in each time of "write", "erase", and "read", a voltage Vd applied to the diffusion region MD, which is a drain region, a voltage Vcg applied to the control gate electrode CG, a voltage Vmg applied to the memory gate electrode MG, a voltage Vs applied to the diffusion region MS, which is a source region, and a voltage Vb applied to the well region PW are described.

Note that what is shown in the table of FIG. 6 is a suitable example of the voltage application condition, and is not limited to this, and can be variously changed as necessary. In the present embodiment, injection of electrons into the charge storage layer CSL is defined as "writing", and injection of holes into the charge storage layer CSL is defined as "erasing".

The write operation is performed by a write method using hot electron injection by source side injection, which is referred to as a Source Side Injection (Source Side Injection) method. For example, a voltage as shown in the column of "write" in FIG. 6 is applied to each portion of the selected memory cell MCa to be written, and electrons are injected into the charge storage layer CSL of the selected memory cell MCa to be written.

At this time, hot electrons are generated in a channel region of the fin FA covered with the memory gate electrode MG and the control gate electrode CG, and hot electrons are injected into the charge storage layer CSL under the memory gate electrode MG. The injected hot electrons are captured by the trap level in the charge storage layer CSL, and as a result, the threshold voltage of the memory transistor having the memory gate electrode MG rises. That is, the memory transistor is in the write state.

The erase operation is performed by an erase method using hot hole injections by BTBT, which is called a BTBT (Band to Band Tunneling) method. That is, holes generated by BTBT in the diffusion region MS are injected into the charge storage layer CSL to erase the charge storage layer CSL. For example, voltages as shown in the column of "erase" in FIG. 6 are applied to respective portions of the selected memory cell MCa to be erased, holes are generated by BTBT phenomena, and holes are injected into the charge storage layer CSL of the selected memory cell MCa by electric field acceleration. As a result, the threshold voltage of the memory transistor is lowered. That is, the memory transistor is in the erased state.

In the read operation, for example, a voltage as shown in the column of "read" in FIG. 6 is applied to each portion of the selected memory cell MCa to be read. By setting the voltage Vmg applied to the memory gate electrode MG at the time of reading to a value between the threshold voltage of the memory transistor in the write state and the threshold voltage of the memory transistor in the erase state, it is possible to discriminate between the write state and the erase state.

A Method of Manufacturing a Semiconductor Device

Figure 7:
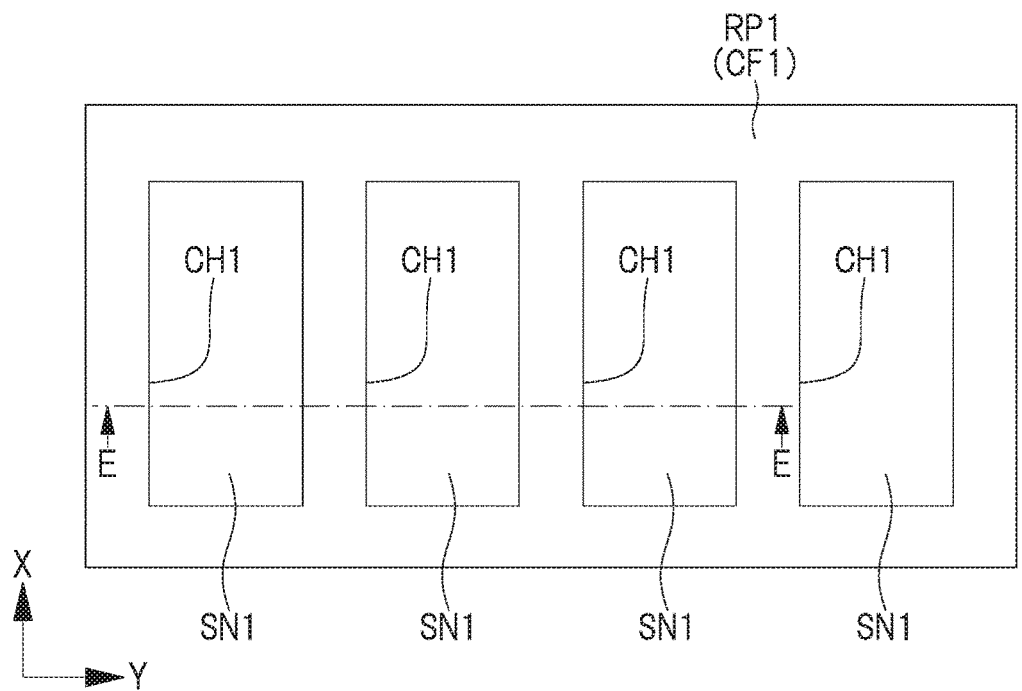
FIG. 7 is a plan view illustrating a manufacturing process of a semiconductor device according to the first embodiment.

Hereinafter, a method of manufacturing a semiconductor device according to the present embodiment will be described with reference to FIGS. 7 to 27. FIG. 7 is a plan view of a region in which a plurality of fins FA are formed, FIGS. 8 to 12 are cross-sectional views taken along line E-E of FIG. 7, FIGS. 13 to 15, FIGS. 17 to 19, and FIGS. 21 to 27 are cross-sectional views taken along line A-A and line B-B of FIG. 1, and FIG. 16 is a cross-sectional view taken along line D-D of FIG. 1. FIG. 20 is a perspective view corresponding to FIG. 19.

Hereinafter, a manufacturing process of the fin FA will be described with reference to FIGS. 7 to 12.

FIG. 7 shows a planar pattern of the resist pattern RP1 and the conductive film CF1, and shows a state in which a plurality of openings CH1 are formed in the conductive film CF1. FIGS. 8 to 12 are cross-sectional views taken along the line E-E of FIG. 7, but also along the direction Y of FIG. 1.

Figure 8:
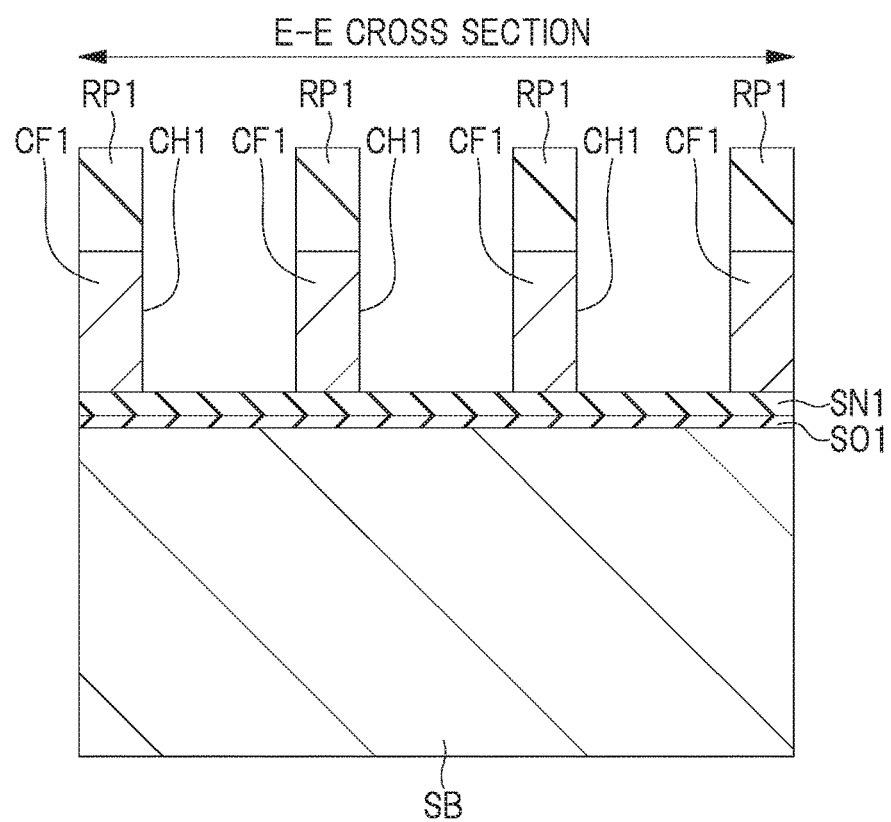
FIG. 8 is a cross-sectional view illustrating a manufacturing process of a semiconductor device according to the first embodiment.

First, as shown in FIG. 8, a semiconductor substrate SB made of p-type monocrystalline silicon or the like having a resistivity of, for example, about 1 to 10 Ω cm is prepared. Next, an insulating film SO1, an insulating film SN1, and a conductive film CF1 are formed in this order on the upper surface of the semiconductor substrate SB. The insulating film SO1 is made of, for example, silicon oxide, and can be formed by, for example, a thermal oxidation method or a CVD (Chemical Vapor Deposition) method. The thickness of the insulating film SO1 is about 5 to 10 nm. The insulating film SN1 is made of, for example, silicon nitride, and is formed by, for example, a CVD method. The thickness of the insulating film SN1 is about 20 to 100 nm. The conductive film CF1 is made of, for example, amorphous carbon, and is formed by, for example, a CVD method. The thickness of the conductive film CF1 is about 20 to 200 nm.

Next, a resist pattern RP1 is formed on the conductive film CF1, and dry etching is performed by using the resist pattern RP1 as a mask to remove a part of the conductive film CF1 exposed from the resist pattern RP1. As a result, a plurality of openings CH1 having substantially the same pattern as the resist pattern RP1 are formed in the conductive film CF1, and a part of the insulating film SN1 is exposed from the conductive film CF1. Thereafter, the resist pattern RP1 is removed by ashing or the like.

Figure 9:
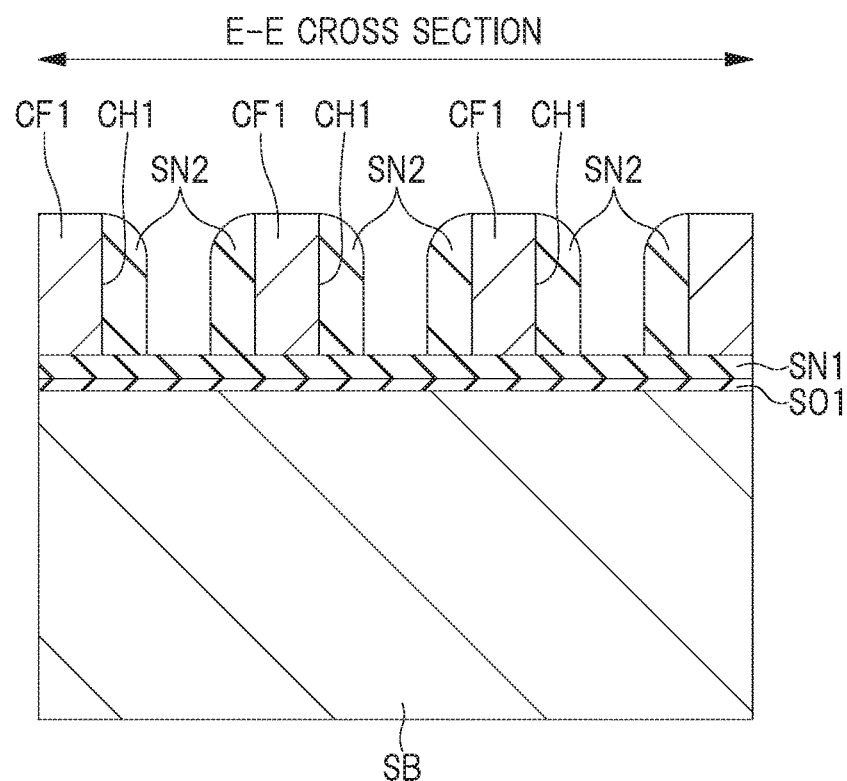
FIG. 9 is a cross-sectional view illustrating a manufacturing process following FIG. 8.

FIG. 9 shows a step of forming the insulating film SN2.

An insulating film SN2 made of, e.g., silicon nitride is formed on the upper surface and the side surface of the conductive film CF1 and on the upper surface of the insulating film SN1 exposed at the bottom of the opening CH1 by, e.g., CVD. The thickness of the insulating film SN2 is about 20 to 40 nm. Next, anisotropic etching is performed on the insulating film SN2 to leave the insulating film SN2 on the side surface of the conductive film CF1 in the opening CH1. That is, the spacer-like insulating film SN2 is formed on the side surface of the conductive film CF1 in a self-aligned manner.

Figure 10:
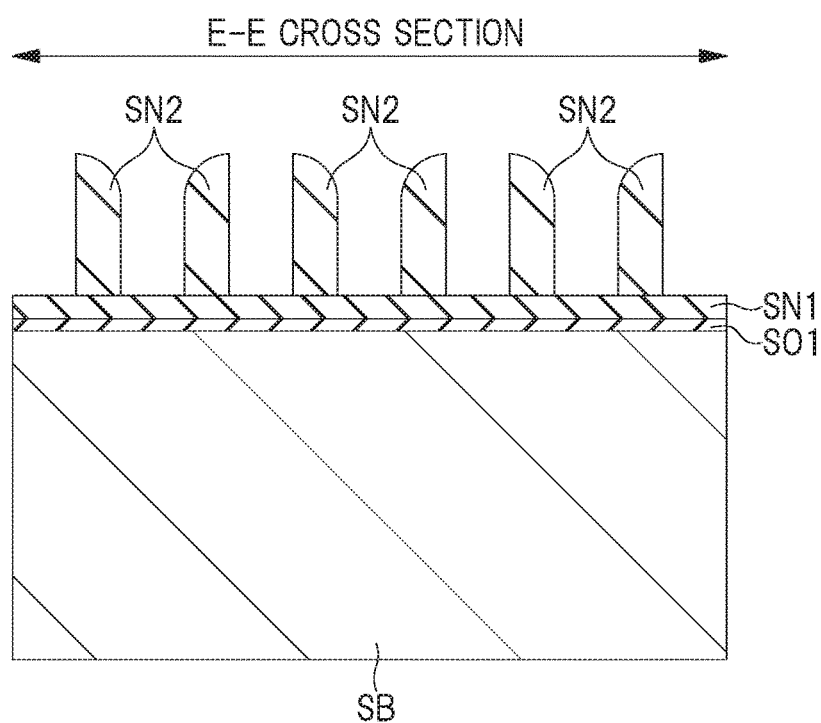
FIG. 10 is a cross-sectional view illustrating a manufacturing process following FIG. 9.

FIG. 10 shows a step of removing the conductive film CF1.

The conductive film CF1 is removed by dry etching and wet etching under conditions in which the insulating films SN1 and SN2 are difficult to be etched.

Figure 11:
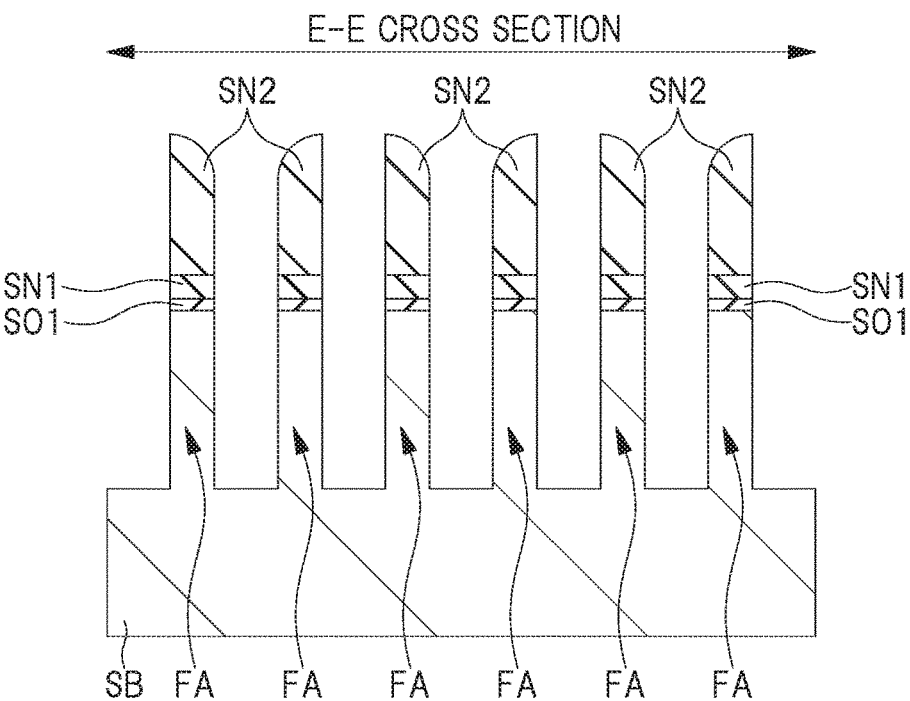
FIG. 11 is a cross-sectional view illustrating a manufacturing process following FIG. 10.

FIG. 11 shows a process of forming the fin FA.

By performing anisotropic dry etching using the insulating film SN2 as a mask, the insulating film SN1, the insulating film SO1, and a part of the semiconductor substrate SB are sequentially removed. As a result, a fin FA which is a part of the semiconductor substrate SB and protrudes from the semiconductor substrate SB is formed immediately below the insulating film SN2. In the present embodiment, the height of the fin FA is about 150 to 250 nm, and the width of the fin FA is about 20 to 40 nm.

As described above, in the present embodiment, the insulating film SN2 served as a mask for forming the fin FA is formed on the side surface of the conductive film CF1 in the opening CH1 in a self-aligned manner. Therefore, the insulating film SN2 does not become an isolated pattern, and is not easily collapsed. Further, although the width of the fin FA is determined by the width of the insulating film SN2, since the width of the insulating film SN2 can be easily adjusted by changing the conditions of the anisotropic dry etching process, the method of manufacturing of the present embodiment is suitable for miniaturization of the fin FA.

For example, in the case where the opening CH1 is not provided in the conductive film CF1 and the insulating film SN2 is formed on the insulating film SN1 by patterning using a resist pattern, the insulating film SN2 tends to collapse. Further, since the width of the fin FA depends on the resolution of the resist pattern, such a method is not suitable for miniaturization of the fin FA.

Figure 12:
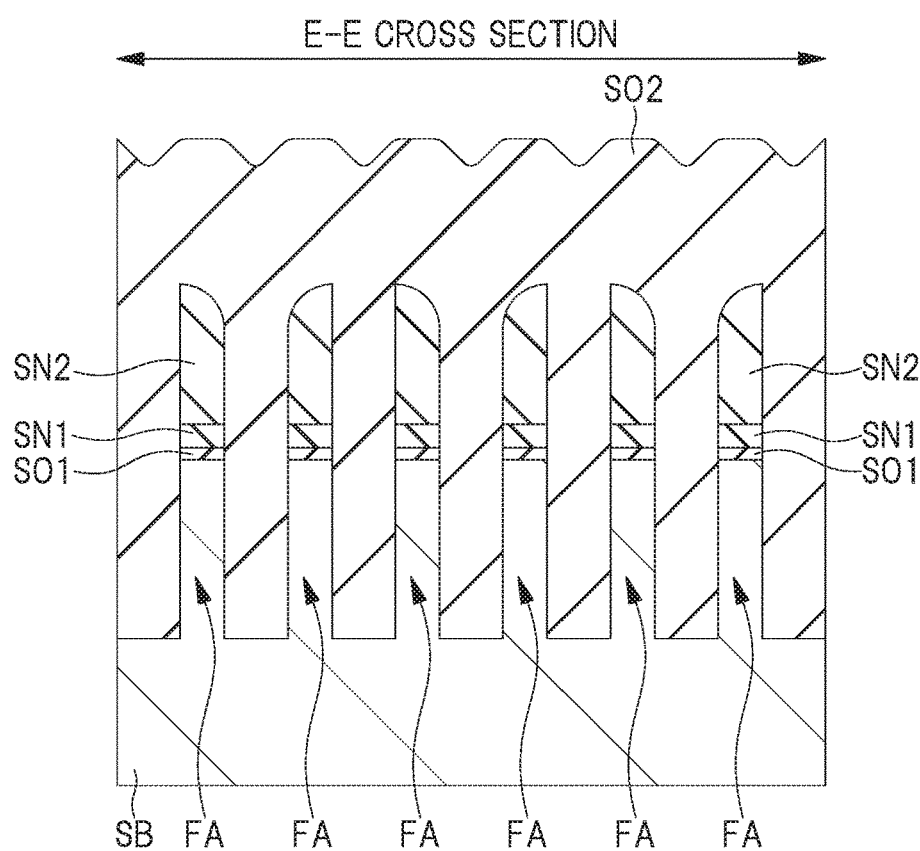
FIG. 12 is a cross-sectional view illustrating a manufacturing process following FIG. 11.

FIG. 12 shows a step of forming the insulating film SO2.

An insulating film SO2 made of, for example, silicon oxide or the like is deposited by, for example, CVD so as to fill the space between the plurality of fins FA and cover the insulating film SN2.

Figure 13:
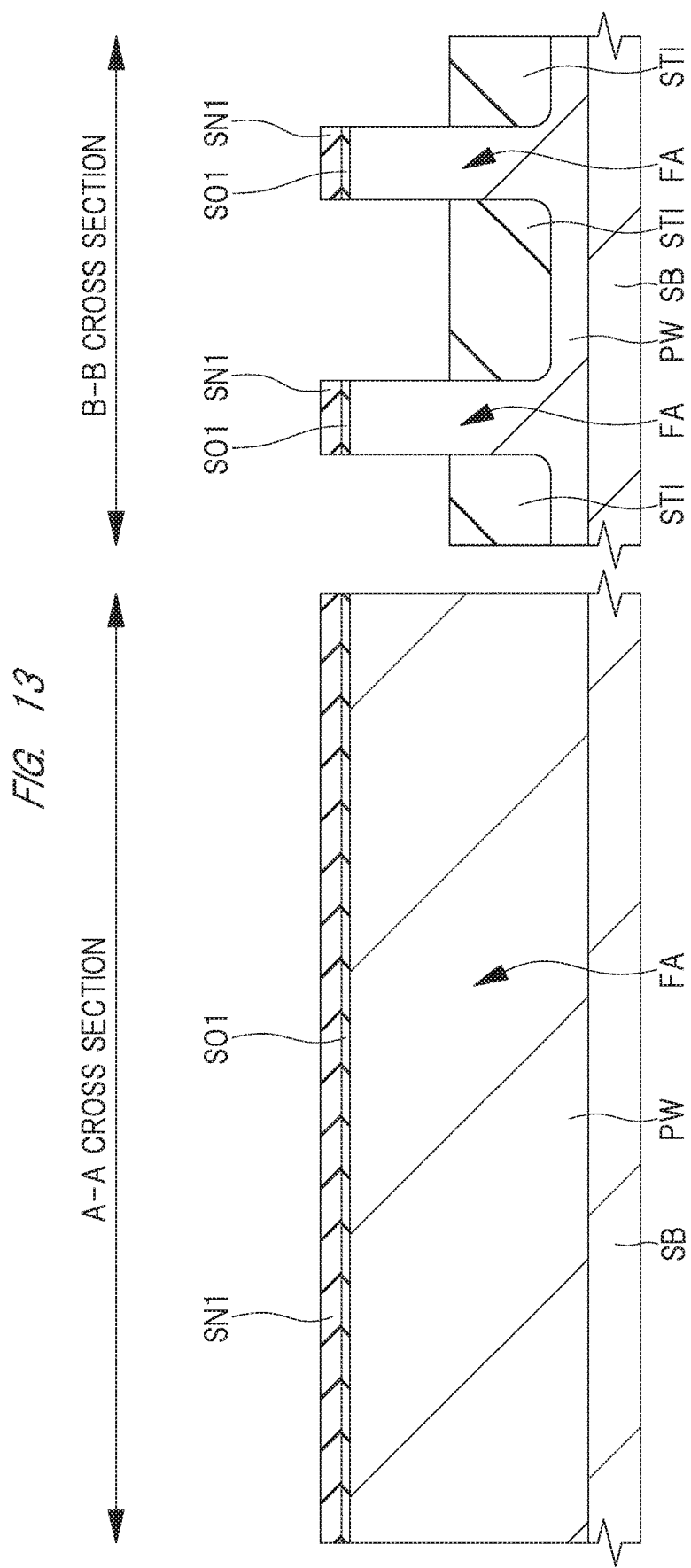
FIG. 13 is a cross-sectional view illustrating a manufacturing process following FIG. 12.

Hereinafter, the manufacturing process subsequent to FIG. 12 will be described with reference to FIGS. 13 to 27. FIG. 13 shows a step of forming the element isolation portion STI and the well PW, and a step of removing the insulating film SN2.

First, the upper surface of the insulating film SO2 is polished by a CMP method. At this time, the insulating film SN2 functions as an etching stopper film for the polishing process. Next, wet etching is performed on the insulating film SO2, whereby the upper surface of the insulating film SO2 is retracted to expose a part of the side surface of the fin FA. The receded insulating film SO2 is served as an element isolation portion STI.

Next, wet etching is performed to remove the insulating film SN2. The insulating film SO1 and the insulating film SN1 are left on the upper surface of the fin FA.

Next, a p-type well region PW is formed in the semiconductor substrate SB including the fin FA by introducing an impurity into the semiconductor substrate SB including the fin FA by using a photolithography method and an ion implantation method. The impurity for forming the p-type well regions PW is, for example, boron (B) or boron difluoride ($BF_2$). The well region PW is formed to extend over the entire fin FA and a part of the semiconductor substrate SB.

In this embodiment, although the diffusion region MD and the diffusion region MS are formed by using the insulating film SO3 in a later step, an n-type impurity may be introduced into a part of the fin FA in which the diffusion region MD and the diffusion region MS are to be formed by using a photolithography method and an ion implantation method after the step of forming the well region PW. The region into which such an impurity is introduced can be used as a part of the diffusion region MD and a part of the diffusion region MS.

Figure 14:
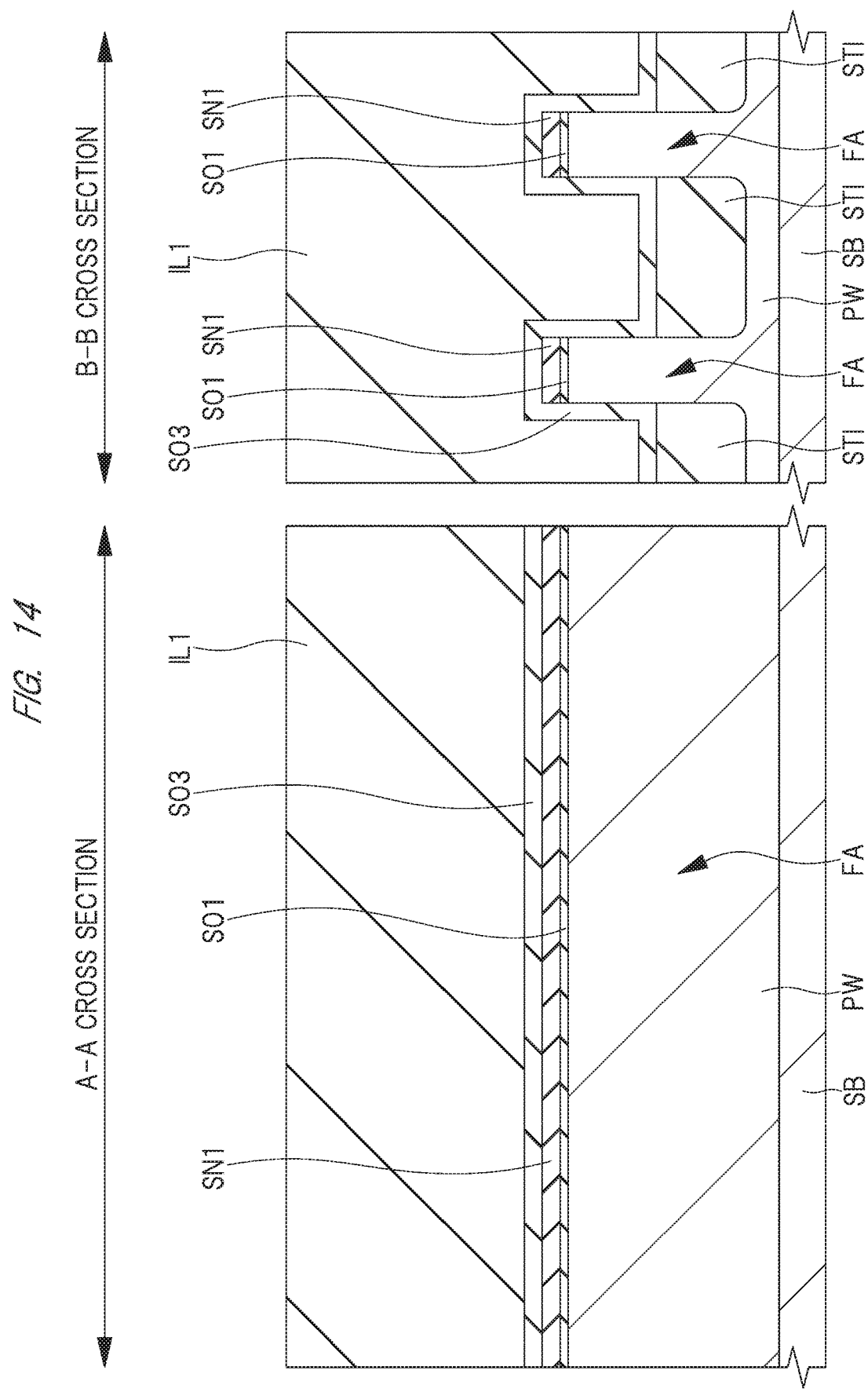
FIG. 14 is a cross-sectional view illustrating a manufacturing process following FIG. 13.

FIG. 14 shows a step of forming the insulating film SO03 and the interlayer insulating film IL1.

First, an insulating film SO3 is formed on the insulating film SN1, the side surface of the fin FA, and the element isolation portion STI by, e.g., CVD. The insulating film SO03 is a silicon oxide film into which an n-type impurity such as phosphorus (P) is introduced, and has a thickness of about 20 nm. Next, an interlayer insulating film IL1 made of, e.g., silicon oxide is formed on the insulating film SO3 by, e.g., CVD. The thickness of the interlayer insulating film IL1 is about 400 nm. Next, the upper surface of the interlayer insulating film IL1 is planarized by the CMP method.

Figure 15:
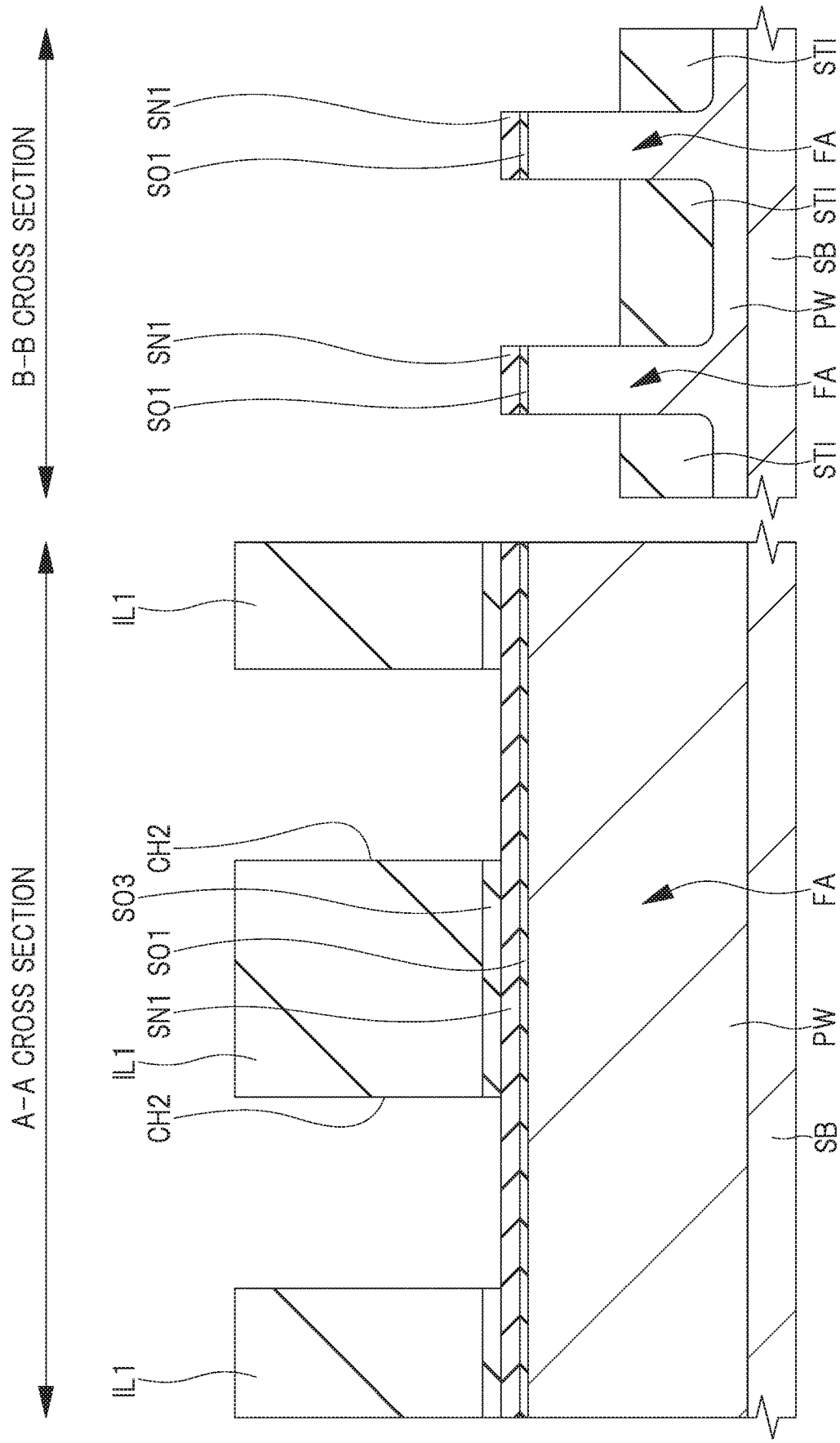
FIG. 15 is a cross-sectional view illustrating a manufacturing process following FIG. 14.
Figure 16:
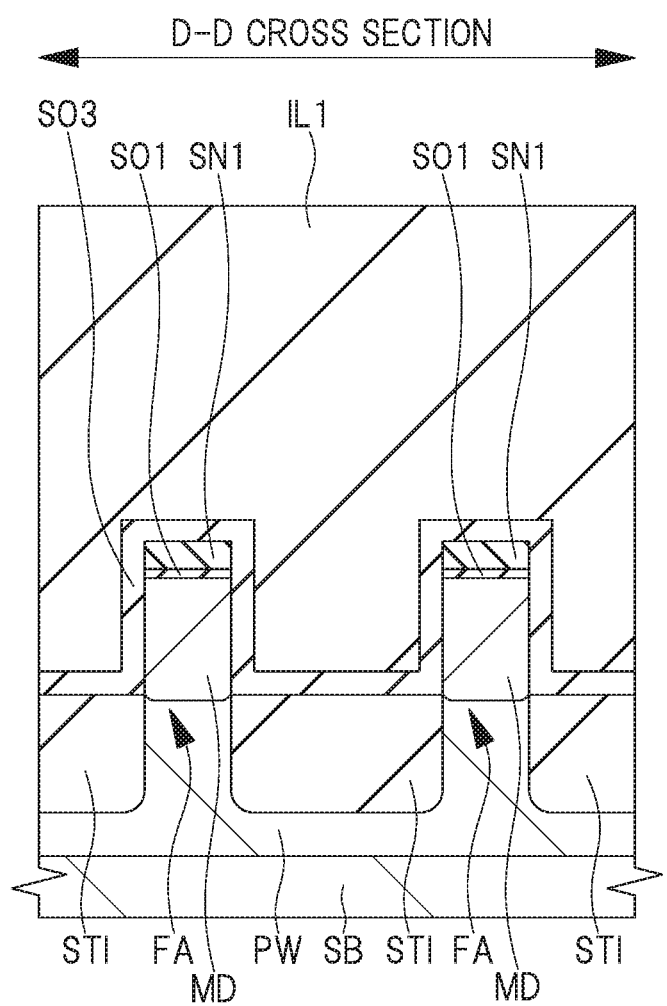
FIG. 16 is a cross-sectional view illustrating a manufacturing process following FIG. 15.

FIG. 15 shows a step of forming the opening CH2.

The interlayer insulating film IL1 and the insulating film SO03 are selectively patterned by a photolithography method and a dry etching process, whereby openings CH2 are formed in the interlayer insulating film IL1 and the insulating film SO3. As shown in the A-A cross section, the insulating film SO1 and the insulating film SN1 are left on the upper surface of the fin FA inside the openings CH2, but as shown in the B-B cross section, the side surface of the fin FA and the upper surface of the element isolation portion STI are exposed in the openings CH2. That is, the openings CH2 extends in the Y direction shown in FIG. 1, and is formed to open a part of the fin FA and a part of the element isolation portion STI. Inside the openings CH2, a memory gate electrode MG, a control gate electrode CG, a gate insulating film GF1, and a gate insulating film GF2 are formed in a later step. The fin FA located at the bottom of the openings CH2 is served as a channel region of the memory cell MC.

FIG. 16 shows a manufacturing process subsequent to FIG. 15, and shows a cross section along the line D-D of FIG. 1, and shows a process of forming the diffusion region MD.

In the D-D cross section, the insulating film SO03 is formed so as to be in contact with the side surface of the fin FA. In this state, by performing heat treatment at about 800 to 950° C., the n-type impurity included in the insulating film SO3 is diffused into the fin FA and activated. A diffusion region MD is formed in the fin FA by the diffused n-type impurity. Although not shown, diffusion regions MS are also formed in the fins FA in this step.

In the present embodiment, the diffusion region MD and the diffusion region MS are formed in a self-aligned manner with respect to the openings CH2. In other words, the diffusion region MD and the diffusion region MS are formed in the fin FA that is not opened by the openings CH2.

Figure 17:
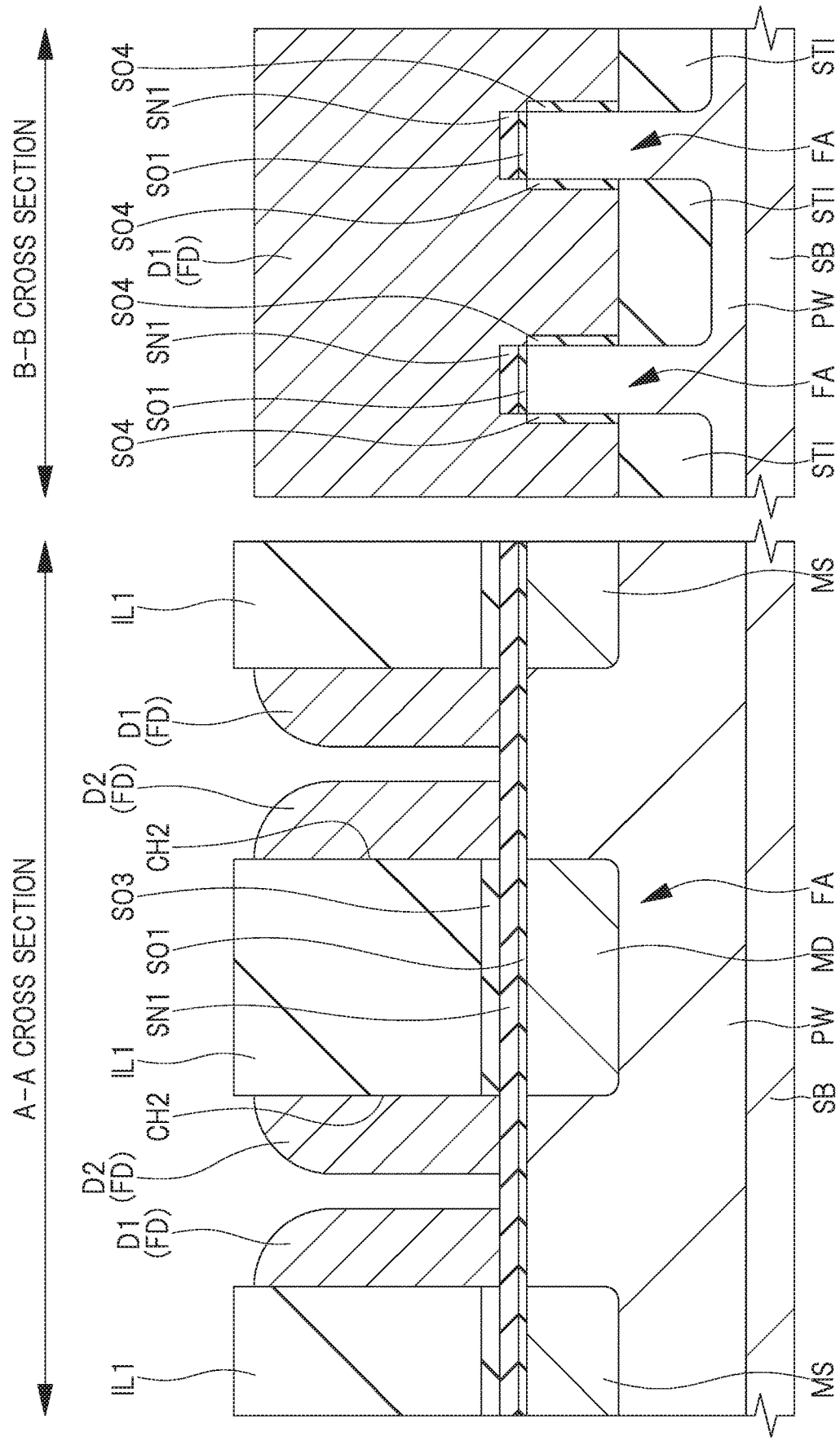
FIG. 17 is a cross-sectional view illustrating a manufacturing process following FIG. 16.

FIG. 17 shows a process of forming the insulating film SO4, the conductive film FD, the dummy member D1, and the dummy member D2.

First, an insulating film SO4 made of silicon oxide is formed on the side surface of the fin FA exposed in the B-B cross section by a thermal oxidation method. Next, a conductive film FD such as a polycrystalline silicon film is deposited on the interlayer insulating film IL1 and the insulating film SN1 by, e.g., CVD so as to fill the openings CH2. Next, anisotropic etching is performed on the conductive film FD to remove the conductive film FD on the interlayer insulating film IL1, and a spacer-shaped dummy material D1 and a dummy material D2 are formed in the openings CH2 in a self-aligned manner. That is, inside openings CH2, a dummy material D1 is formed on the first side of the interlayer insulating film IL1, and a dummy material D2 is formed on the second side of the interlayer insulating film IL1 facing the first side. The widths of the spacer-shaped dummy material D1 and the dummy material D2 in the A-A cross section are about 30 to 40 nm, respectively. Although not shown here, the dummy material D1 and the dummy material D2 are formed of the same conductive film FD and are integrated at the end of the memory cell MC.

As shown in FIG. 17, the dummy material D1 and the dummy material D2 are formed to be separated from each other in one opening CH2. Here, although not shown, an insulating film SO4 is formed on the side surface of the fin FA located between the dummy material D1 and the dummy material D2. Therefore, during the anisotropic etching process for the polycrystalline silicon film, the fin FA made of silicon is protected by the insulating film SO4. Therefore, it is possible to prevent the fin FA located between the dummy material D1 and the dummy material D2 from being scraped.

Figure 18:
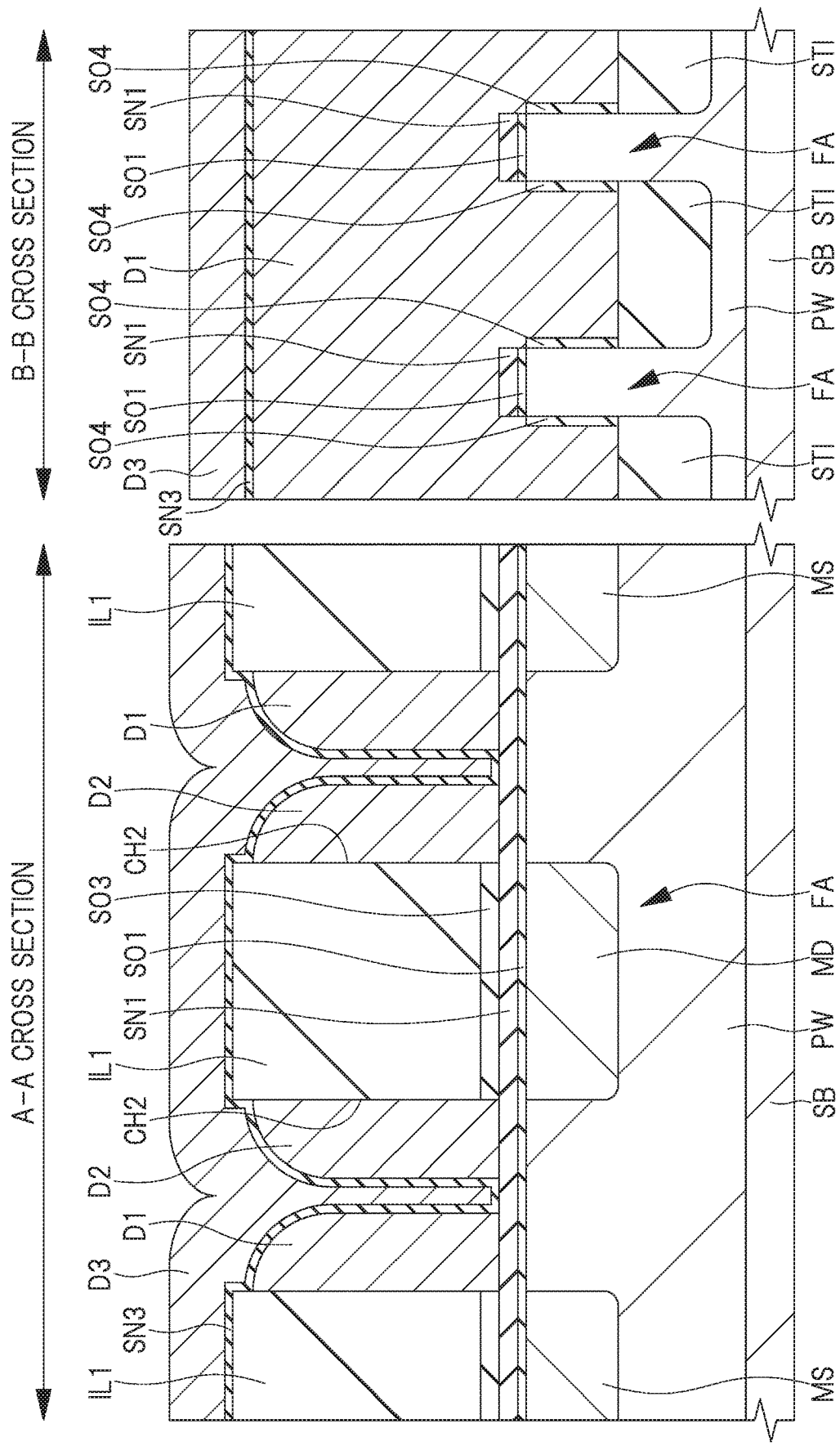
FIG. 18 is a cross-sectional view illustrating a manufacturing process following FIG. 17.

FIG. 18 shows a step of forming the insulating film SN3 and the dummy material D3.

An insulating film SN3 made of, for example, silicon nitride is formed by, for example, CVD so as to cover the dummy material D1 and the dummy material D2 inside the openings CH2. The thickness of the insulating film SN3 is about 2 to 3 nm. Next, a dummy material D3 made of a conductive film such as a polycrystalline silicon film is deposited on the insulating film SN3 by, e.g., CVD. The dummy material D3 is formed in a self-aligned manner so as to fill a space between the dummy material D1 and the dummy material D2 adjacent to each other in the openings CH2. The material of the dummy material D3 may be another material different from the polycrystalline silicon film. However, the dummy material D3 is removed by etching together with the dummy material D1 or the dummy material D2 in a later step. Therefore, in order to avoid complication of the etching process, the material of the dummy material D3 is preferably the same as that of the dummy material D1 and the dummy material D2.

Figure 19:
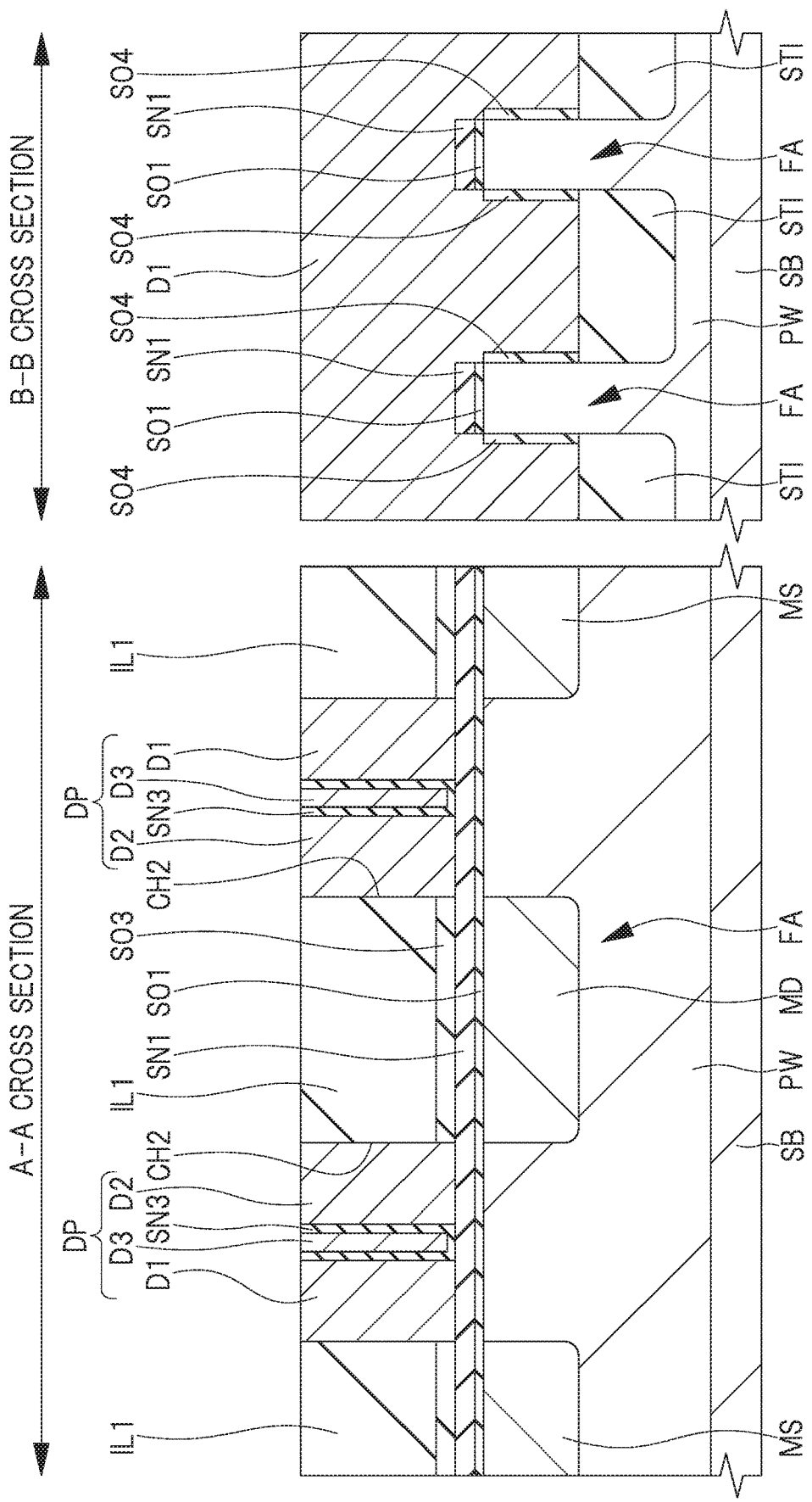
FIG. 19 is a cross-sectional view illustrating a manufacturing process following FIG. 18.
Figure 20:
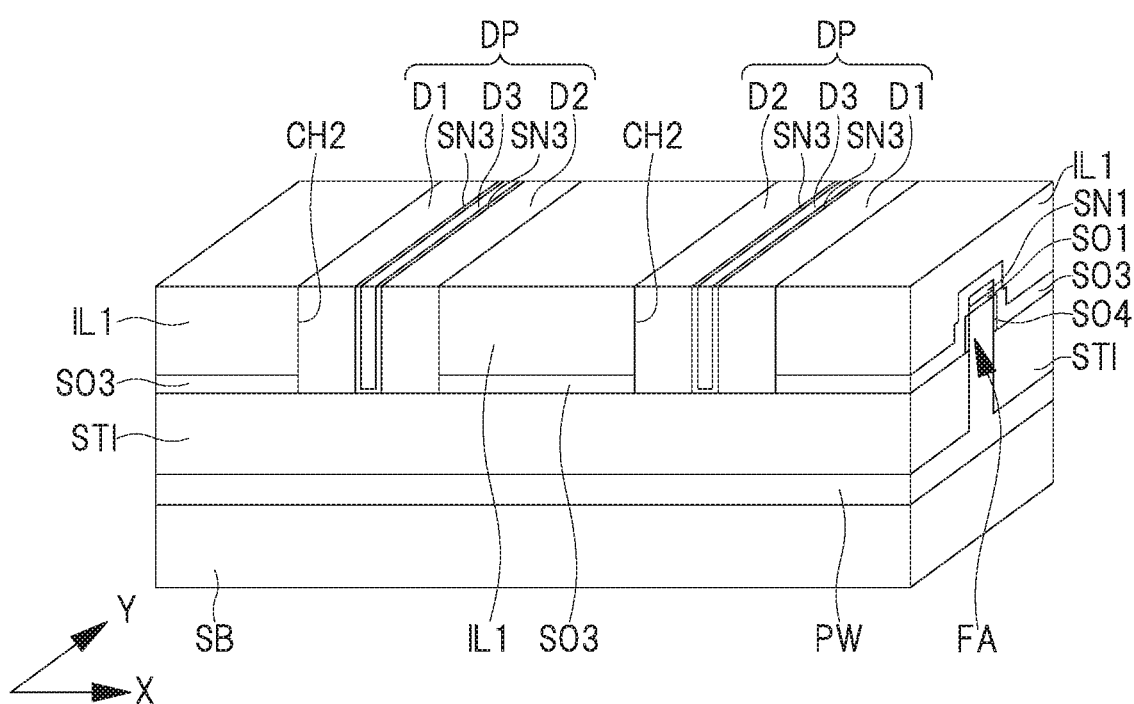
FIG. 20 is a perspective view at the time of completion of the manufacturing process of FIG. 19.

FIG. 19 shows a polishing process for the insulating film SN3, the interlayer insulating film IL1, the dummy material D1, the dummy material D2, and the dummy material D3.

The insulating film SN3, the interlayer insulating film IL1, the dummy material D1, the dummy material D2, and the dummy material D3 are polished by the CMP method. This lowers these heights. The dummy material D1, the dummy material D2, the dummy material D3, and the insulating film SN3 thus formed in the openings CH2 constitute a part of the dummy pattern DP.

FIG. 20 is a perspective view at the time when the manufacturing process of FIG. 19 is completed.

Here, some of the features of the present embodiment will be described. As shown in FIG. 20, a dummy pattern DP is filled inside the holes CH2. The dummy pattern DP is a pattern for replacing the memory gate electrode MG, the control gate electrode CG, and the like in a later step. One of the features of the present embodiment is that the dummy material D1, the dummy material D2, and the dummy material D3, which are part of the dummy pattern DP, are formed in a self-aligned manner.

Hereinafter, as a comparative example for the features of the present embodiment, the techniques disclosed in Patent Document 2 (Japanese Unexamined Patent Application Publication No. 2017-45860) and Patent Document 3 (Japanese Unexamined Patent Application Publication No. 2014-127527) described above will be described.

Referring to the technique of forming the MONOS transistor as a fin-structure transistor as described in the above-mentioned document 2, first, a control gate electrode CG is formed by patterning so as to cover the upper surface and the side surface of the fin FA, and then a polycrystalline film is formed so as to cover the control gate electrode CG. Next, anisotropic etching is performed on the polycrystalline silicon film to form a memory gate electrode MG in the shape of a sidewall spacer on the side surface of the control gate electrode CG.

However, in the fin structure transistor, when patterning the control gate electrode CG, an etching process having a high aspect ratio is required depending on the height of the fin FA. During processing of the memory gate electrode MG, the memory gate electrode MG is formed not only on the side surface of the control gate electrode CG but also on the side surface of the fin FA. The memory gate electrode MG formed on the side surface of the fin FA may cause a short circuit between adjacent memory cells MC, and needs to be removed. Therefore, in consideration of the height of the fin FA, it is necessary to perform the anisotropic etching process in overetching at the time of processing the memory gate electrode MG. In this case, since the etching is performed in a state where the upper surface of the control gate electrode CG is exposed, it is necessary to form a cap film having an etching selectivity on the control gate electrode CG or to make the thickness of the control gate electrode CG sufficiently thick.

Therefore, the height of the control gate electrode CG increases, and the aspect ratio at the time of patterning the control gate electrode CG becomes very high. In particular, as the miniaturization of the semiconductor element progresses, the control gate electrode CG having a fine gate length and a large thickness exists as an isolated elongated pattern. In this case, the control gate electrode CG may collapse, and the yield of the semiconductor device may be lowered.

On the other hand, there is a technique of replacing a dummy pattern with a control gate electrode CG made of a metal film or the like by a so-called gate last process as described in Patent Document 3. However, the dummy pattern is formed by patterning a polycrystalline silicon film or the like. Therefore, when the technique of Patent Document 3 is applied to a transistor having a fin structure, it is necessary to increase the height of the dummy pattern and form the memory gate electrode MG on the side surface of the dummy pattern by anisotropic etching. That is, also in Patent Document 3, the same problem as in Patent Document 2 occurs, and there is a possibility that the dummy pattern collapses.

In contrast to these techniques, in the present embodiment, as described with reference to FIGS. 15 to 19, the openings CH2 is formed in the interlayer insulating film IL1, and the dummy material D1, the dummy material D2, and the dummy material D3 are formed in self-alignment in the openings CH2. That is, in the openings CH2, the dummy material D1 and the dummy material D2 are formed along the side surface of the interlayer insulating film IL1, and the dummy material D3 is formed along the side surface of the dummy material D1 and the dummy material D2 via the insulating film SN3. Therefore, it is possible to suppress the possibility that the dummy material D1, the dummy material D2, and the dummy material D3 collapse. As described above, according to the present embodiment, it is possible to improve the yield in the manufacturing process of the semiconductor device.

Further, the gate length of the control gate electrode CG, the gate length of the memory gate electrode MG, the thickness of the gate insulating film GF1, and the thickness of the gate insulating film GF2 mainly depend on the diameter of the openings CH2, and can be easily adjusted by the conditions of the anisotropic etching process for processing the dummy material D1 and the dummy material D2. Therefore, miniaturization of the memory cell MC can be promoted.

Hereinafter, a manufacturing process of replacing the region where the dummy pattern DP is formed with the control gate electrode CG, the memory gate electrode MG, the gate insulating film GF1, and the gate insulating film GF2 will be described.

Figure 21:
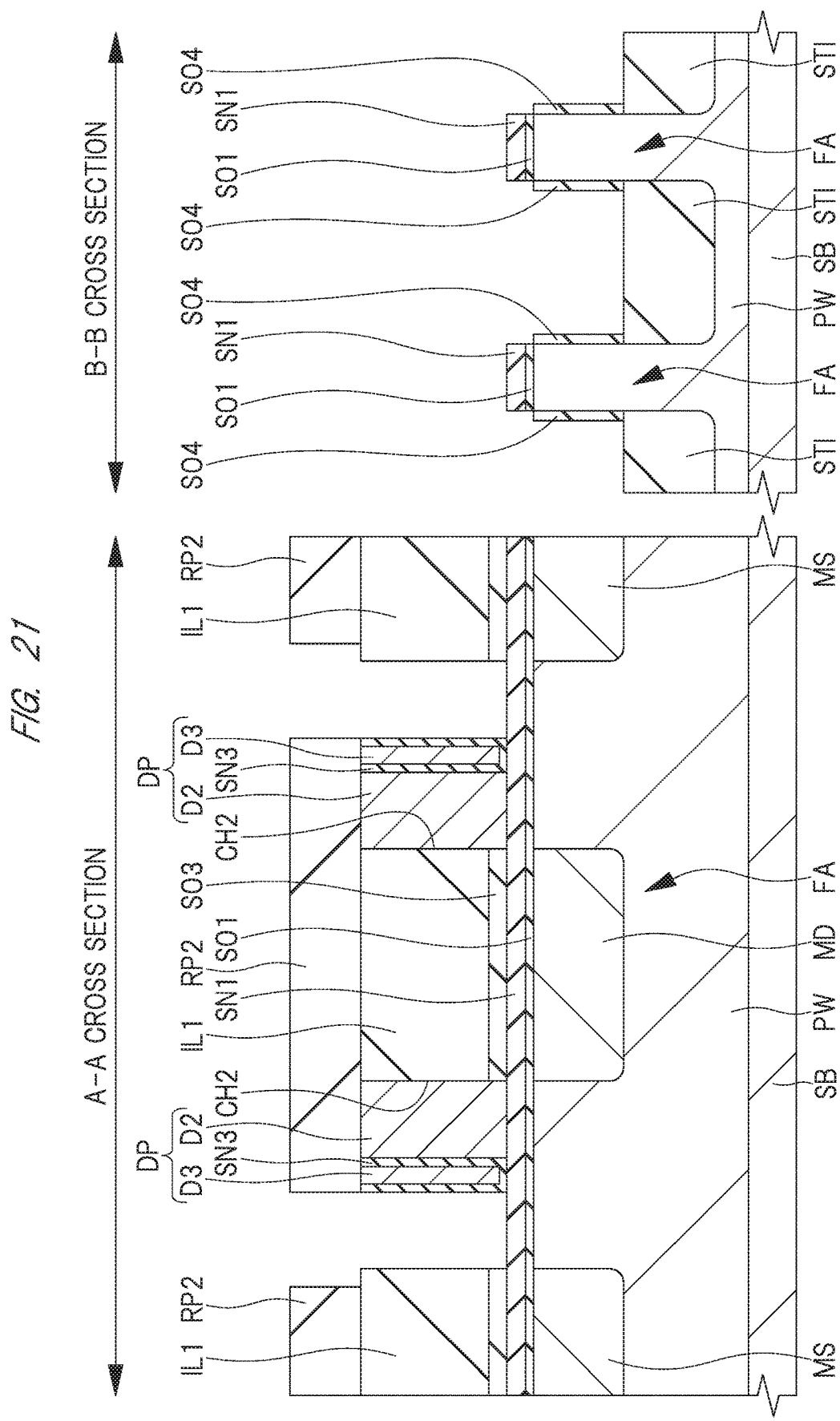

FIG. 21 shows a step of removing the dummy material D1.

First, a resist pattern RP2 having a pattern for opening a dummy material D1, which is a part of the dummy pattern DP, is formed on the interlayer insulating film IL1. Next, dry etching and wet etching are performed by using the resist pattern RP2 as a mask to remove the dummy material D1 formed in the openings CH2. At this time, as shown in the B-B cross section, since the insulating film SO4 formed on the side surface of the fin FA are served as a protective film against the etching process, it is possible to prevent the fin FA from being shaved.

Figure 22:
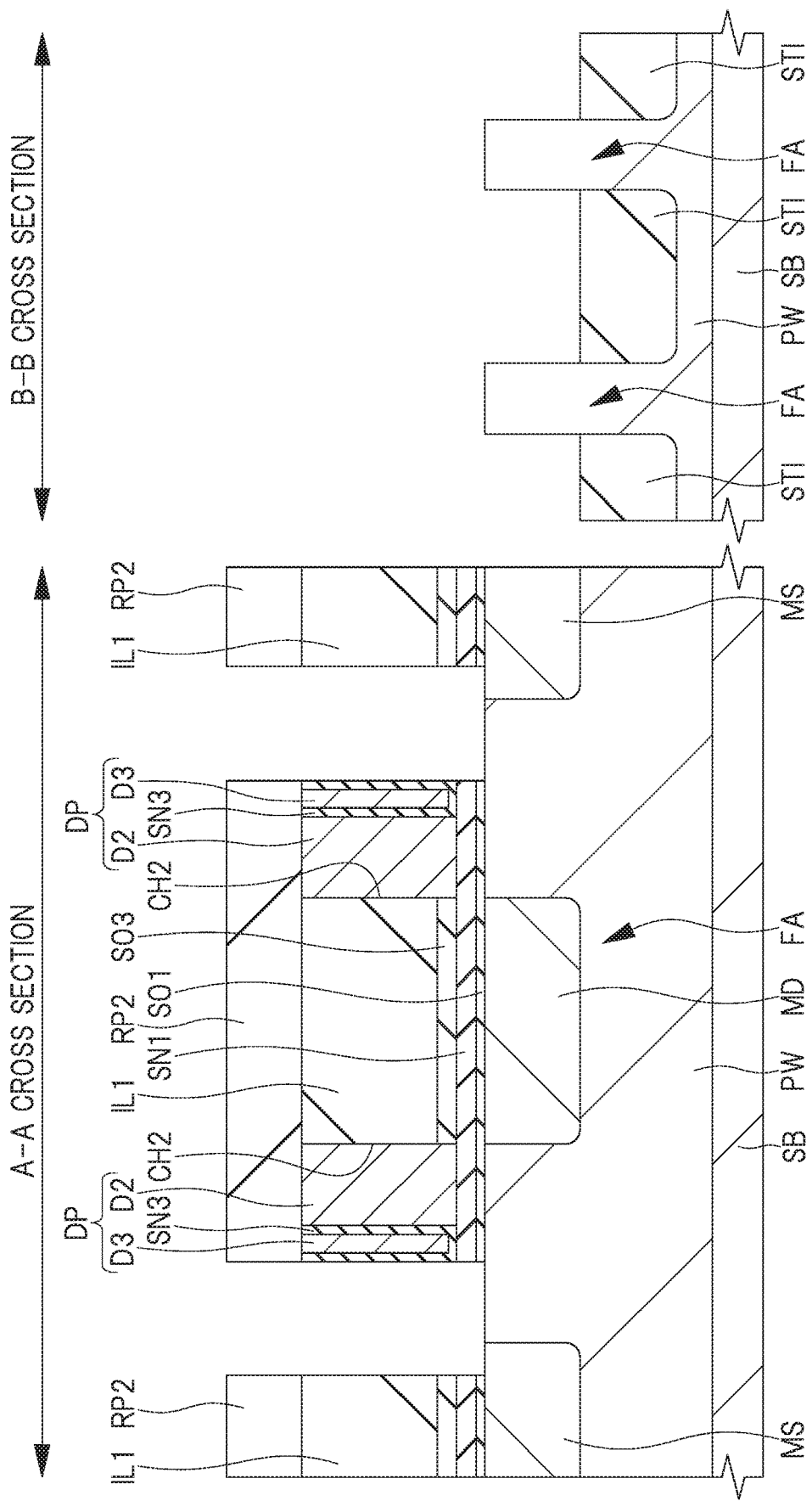
FIG. 22 is a cross-sectional view illustrating a manufacturing process following FIG. 21.

FIG. 22 shows a step of removing the insulating film SO4, the insulating film SO1, and the insulating film SN1.

The insulating film SO1, the insulating film SN1, and the insulating film SO4 exposed by removing the dummy material D1 are removed by dry etching and wet etching using the resist pattern RP2 as a mask. As a result, the upper surface and the side surface of the fin FA not covered with the interlayer insulating film IL1 are exposed as shown in the B-B cross section.

Further, after these steps, an isotropic etching process such as a wet etching process may be further performed to cause a part of the side surfaces of the interlayer insulating film IL1, the insulating film SO3, the insulating film SN1, and the insulating film SO01 in the openings CH2 to recede. By performing such processing, the position of the end portion of the diffusion region MS and the end portion of the memory gate electrode MG to be formed later can be adjusted. FIG. 22 shows a state in which each insulating film such as the interlayer insulating film IL1 in the openings CH2 is retracted. Thereafter, the resist pattern RP2 is removed by ashing or the like.

Figure 23:
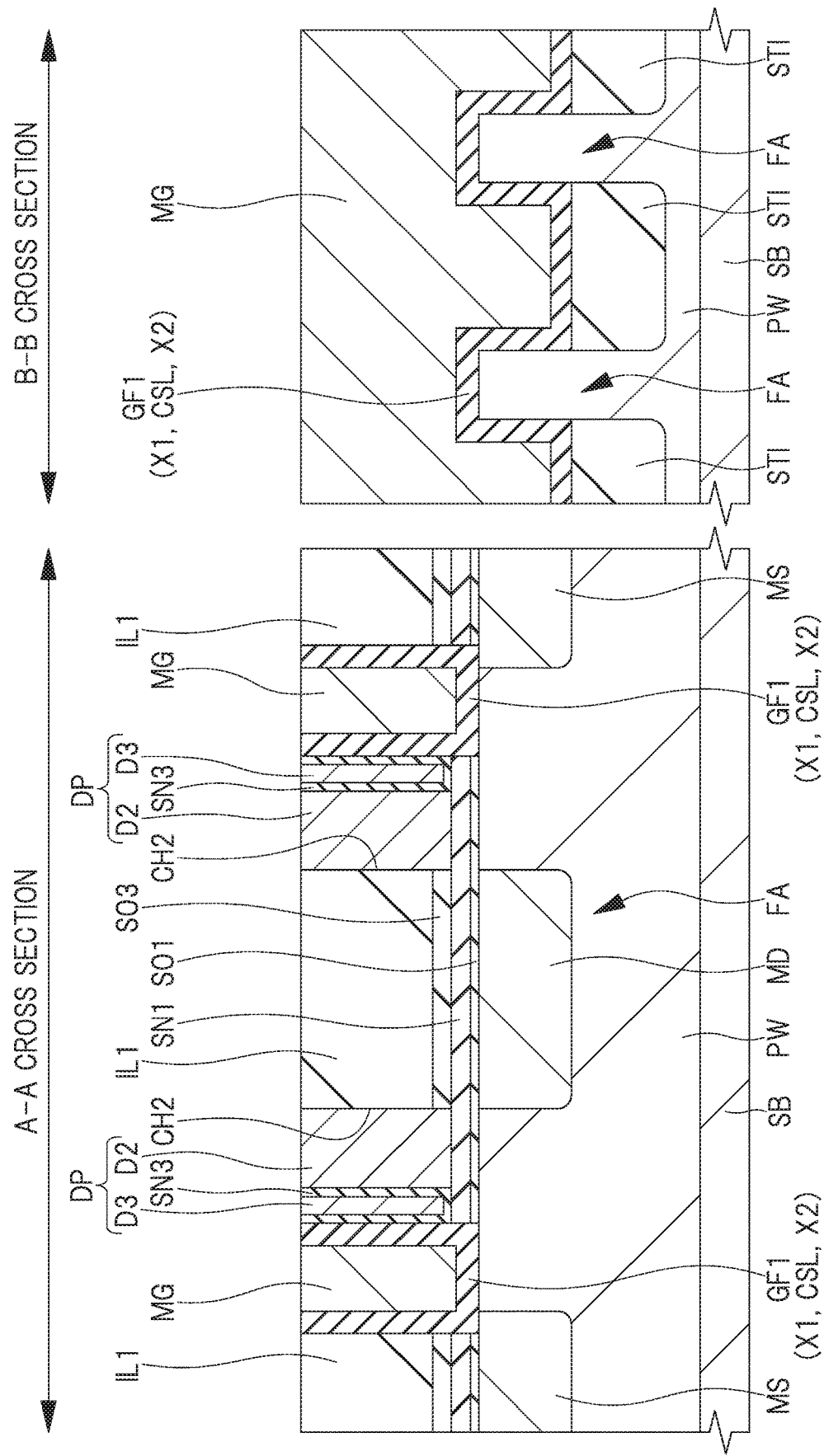
FIG. 23 is a cross-sectional view illustrating a manufacturing process following FIG. 22.

FIG. 23 shows a step of forming the gate insulating film GF1 and the memory gate electrode MG.

First, in the openings CH2, an insulating film X1 made of, for example, silicon oxide is formed on the side surface of the insulating film SN3, the upper surface and the side surface of the interlayer insulating film IL1, and the upper surface and the side surface of the fin FA by, for example, CVD. Next, a charge storage layer CSL made of, e.g., silicon nitride is formed on the insulating film X1 by, e.g., CVD. Instead of the silicon nitride film, the charge storage layer CSL may be a metal oxide film such as a hafnium silicate (HfSiO) film. Next, an insulating film X2 made of, e.g., silicon oxide is formed on the charge storage layer CSL by, e.g., CVD. The insulating film X2 may be a metal oxide film such as an alumina film, for example, instead of a silicon oxide film. The insulating film X1, the charge storage layer CSL, and the insulating film X2 are served as a gate insulating film GF1.

In the present embodiment, the insulating film X1, the charge storage layer CSL, and the insulating film X2 are not shown in detail for the sake of clarity, and these laminated films are shown as the gate insulating film GF1.

Next, a memory gate electrode MG made of, for example, polycrystalline silicon into which an n-type impurity is introduced is formed on the gate insulating film GF1 by, for example, a CVD method. Instead of the polycrystalline silicon film, the memory gate electrode MG may be a tantalum nitride film, a single-layer metal film made of an aluminum film, or a laminated film in which these films are appropriately stacked.

Next, the memory gate electrode MG and the gate insulating film GF1 formed on the upper surface of the interlayer insulating film IL1 are removed by the CMP method. As a result, in the openings CH2, the gate insulating film GF1 and the memory gate electrode MG are filled in the region where the dummy material D1, which is a part of the dummy pattern DP, is removed.

Figure 24:
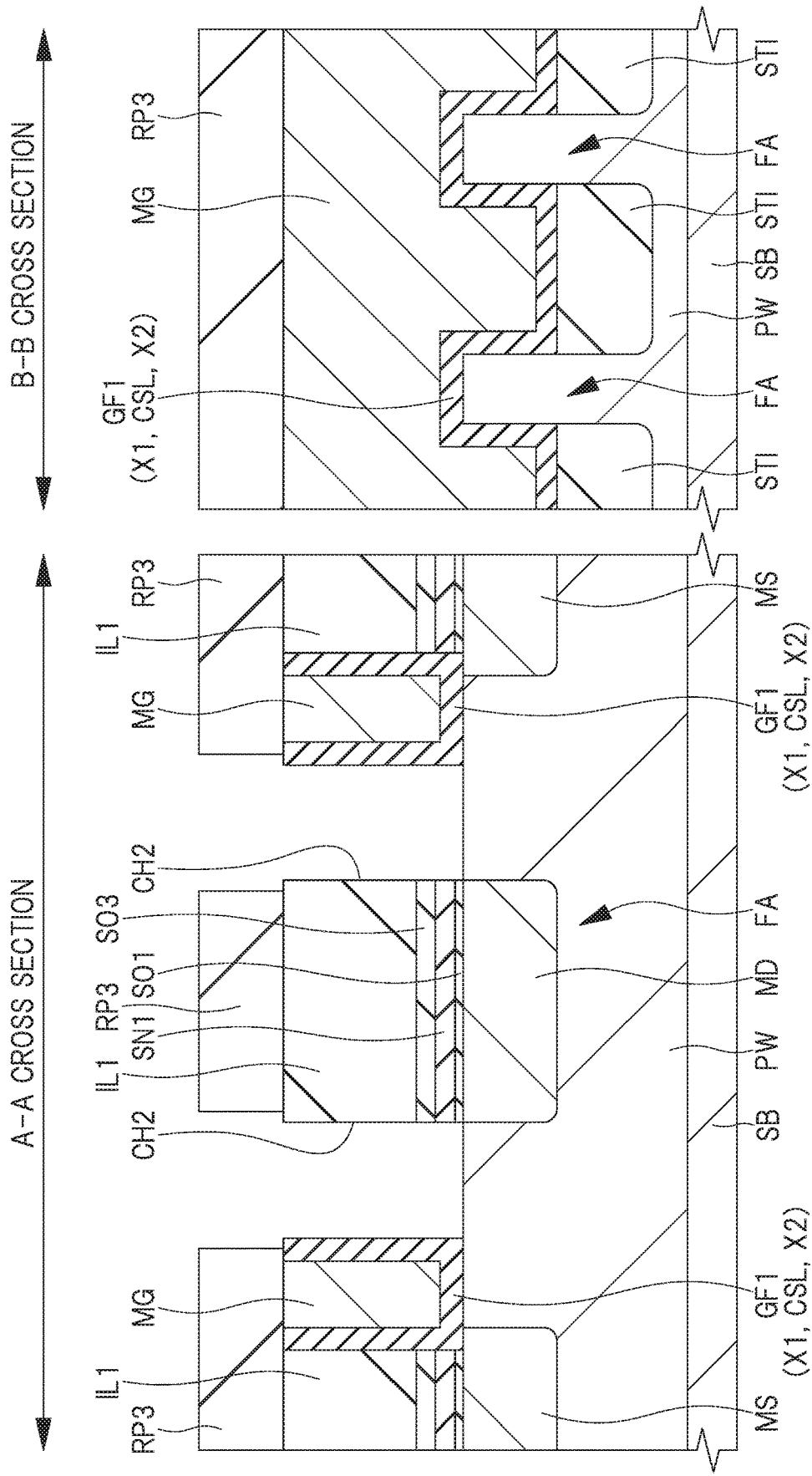
FIG. 24 is a cross-sectional view illustrating a manufacturing process following FIG. 23.

FIG. 24 shows a step of removing the dummy material D2, the dummy material D3, the insulating film SN3, the insulating film SO1, the insulating film SN1, and the insulating film SO4.

First, a resist pattern RP3 having a pattern for opening the dummy material D2, the dummy material D3, and the insulating film SN3, which are the dummy patterns DP left in the openings CH2, is formed on the interlayer insulating film IL1. Next, dry etching and wet etching are performed by using the resist pattern RP3 as a mask to remove the dummy material D2, the dummy material D3, and the insulating film SN3 remaining in the openings CH2. The insulating film SN3 in contact with the gate insulating film GF1 in the openings CH2 may not be removed or may be left. When the insulating film SN3 is left, the dielectric strength between the memory gate electrode MG and the control gate electrode CG, which will be described later, can be improved.

Further, although not shown here, similarly to the process of FIG. 21, since the insulating film SO4 formed on the side surface of the fin FA is served as a protective film against the etching process, it is possible to prevent the fin FA from being shaved.

Next, the insulating film SO1, the insulating film SN1, and the insulating film SO4 exposed by removing the dummy material D2, the dummy material D3, and the insulating film SN3 are removed by dry etching and wet etching using the resist pattern RP3 as a mask. As a result, the upper surface and the side surface of the fin FA are exposed.

Further, after these steps, an isotropic etching process such as a wet etching process may be further performed to cause a part of the side surfaces of the interlayer insulating film IL1, the insulating film SO03, the insulating film SN1, and the insulating film SO01 in the openings CH2 to recede. By performing such processing, the position of the end portion of the diffusion region MD and the end portion of the control gate electrode CG to be formed later can be adjusted. Thereafter, the resist pattern RP3 is removed by ashing or the like.

Figure 25:
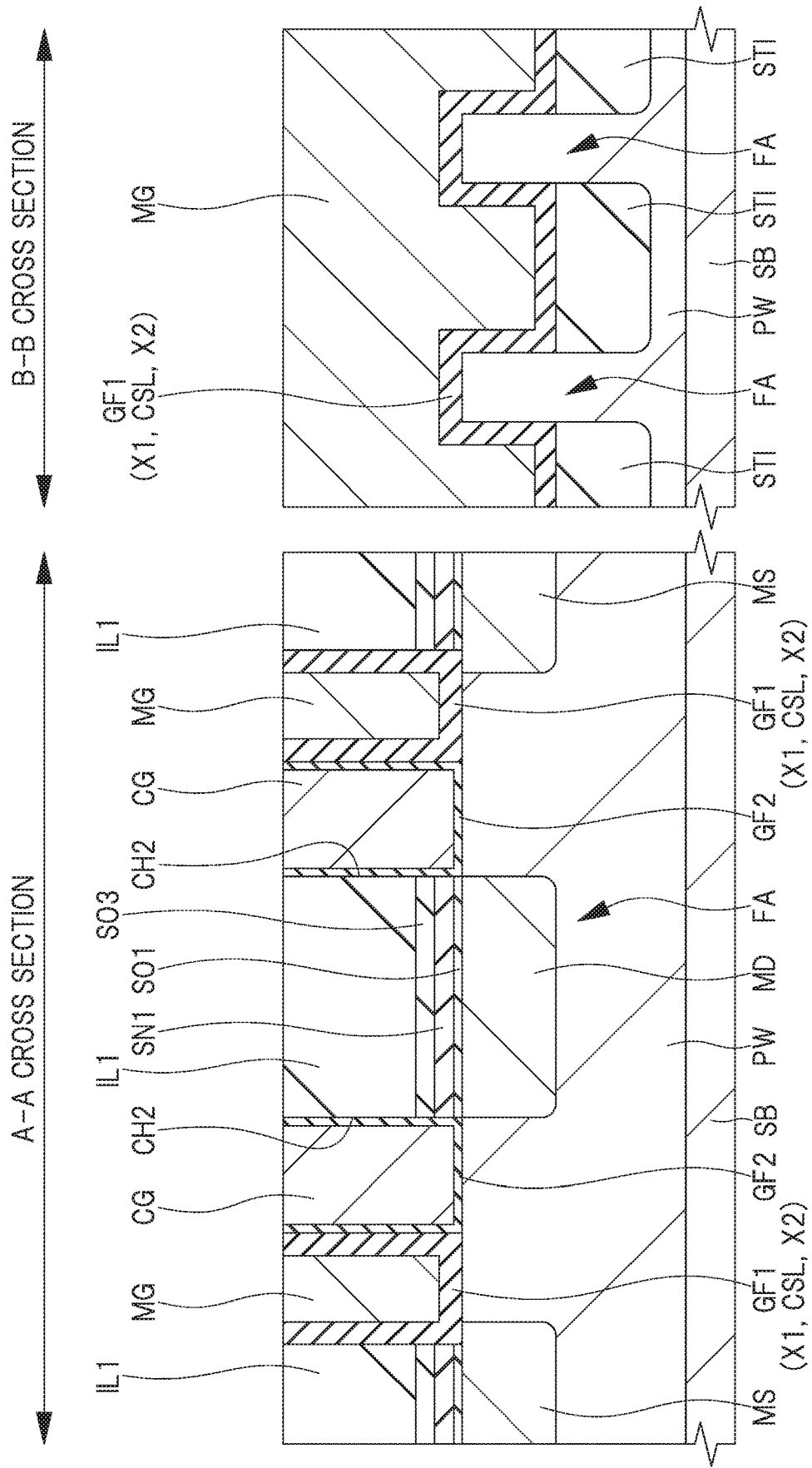
FIG. 25 is a cross-sectional view illustrating a manufacturing process following FIG. 24.

FIG. 25 shows a step of forming the gate insulating film GF2 and the control gate electrode CG.

First, inside the openings CH2, a metal oxide film such as a hafnium oxide film (HfO film) is formed on the side surface of the gate insulating film GF1, the upper surface and the side surface of the interlayer insulating film IL1, and the upper surface and the side surface of the fin FA by, e.g., CVD.

Next, a control gate electrode CG is formed on the gate insulating film GF2 by a sputtering method or a CVD method by using a tantalum nitride film, a single-layer metal film made of an aluminum film, or a laminated film of these films as appropriate.

Next, the control gate electrode CG and the gate insulating film GF2 formed on the upper surface of the interlayer insulating film IL1 are removed by the CMP method. Thus, the gate insulating film GF2 and the control gate electrode CG are filled inside the hole CH2.

Before forming the gate insulating film GF2 and the control gate electrode CG, an insulating film such as a silicon oxide film may be formed in the openings CH2, and an anisotropic etching process may be performed on the insulating film to leave a spacer-shaped insulating film on the side surface of the gate insulating film GF1. When the spacer-shaped insulating film is formed, the dielectric strength between the memory gate electrode MG and the control gate electrode CG can be improved.

As described above, the process of replacing the dummy material D1, the dummy material D2, the dummy material D3, and the insulating film SN3, which are the dummy patterns DP formed in the openings CH2, with the control gate electrode CG, the memory gate electrode MG, the gate insulating film GF1, and the gate insulating film GF2 is completed.

In the present embodiment, the memory gate electrode MG and the gate insulating film GF1 are formed first, and then the control gate electrode CG and the gate insulating film GF2 are formed, but this order may be reversed. However, if the gate insulating film GF2 is thin and the influence of the thermal history is large, the threshold voltage of the control transistor is liable to vary. When the gate insulating film GF2 is formed first, the insulating film X1, the charge storage layer CSL, and the insulating film X2 are sequentially formed in the subsequent step of forming the gate insulating film GF1, and thus the thermal history increases. Therefore, it is preferable to form the memory gate electrode MG and the gate insulating film GF1 first.

Figure 26:
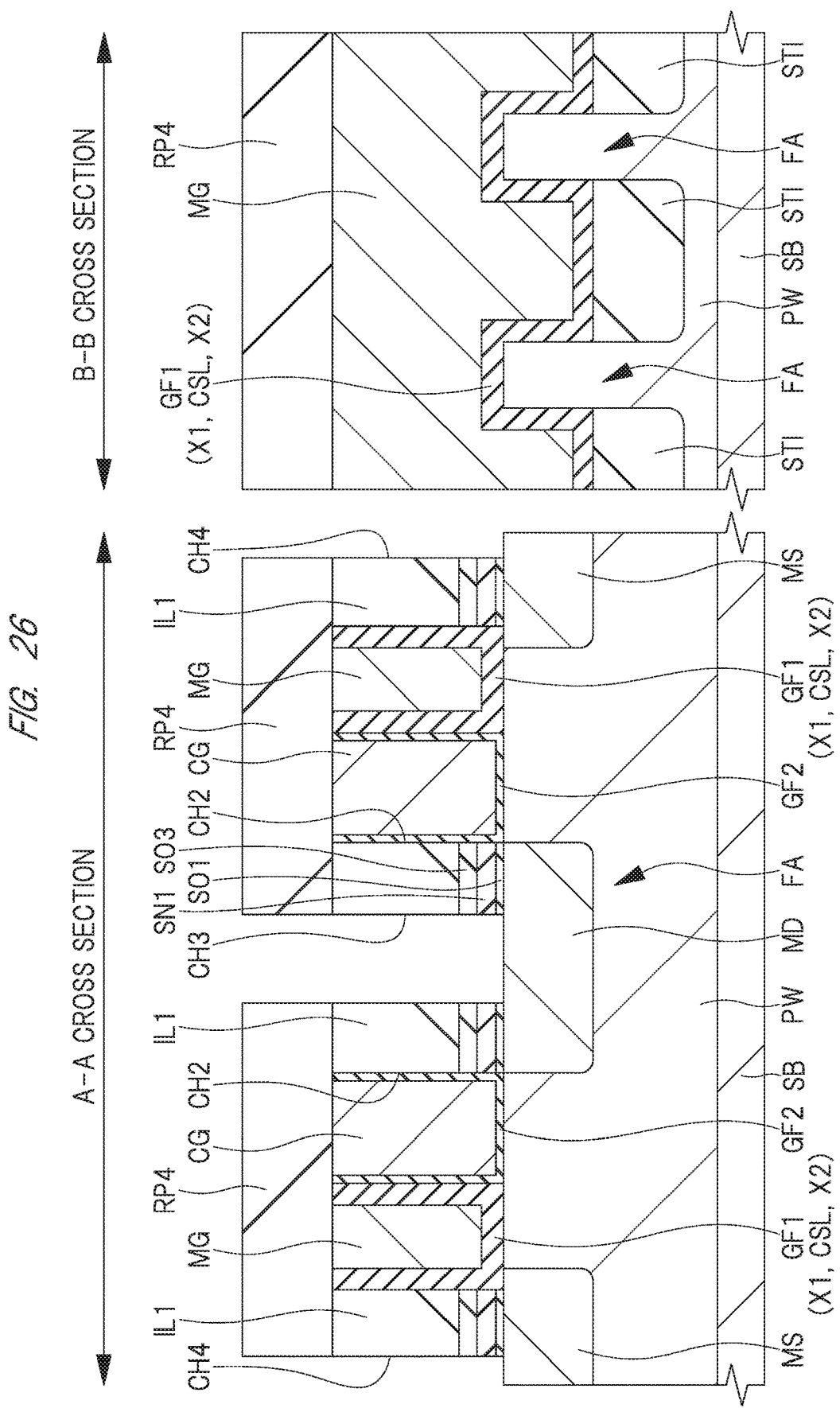
FIG. 26 is a cross-sectional view illustrating a manufacturing process following FIG. 25.

FIG. 26 shows a step of forming the openings CH3 and CH4.

First, a resist pattern RP4 having a pattern in which the diffusion region MD and the diffusion region MS are opened is formed on the interlayer insulating film IL1. Next, dry etching is performed by using the resist pattern RP4 as a mask to form a openings CH3 reaching the diffusion region MD and openings CH4 reaching the diffusion region MS in the interlayer insulating film IL1, the insulating film SO3, the insulating film SN1, and the insulating film SO1. Thereafter, the resist pattern RP4 is removed by ashing or the like.

Figure 27:
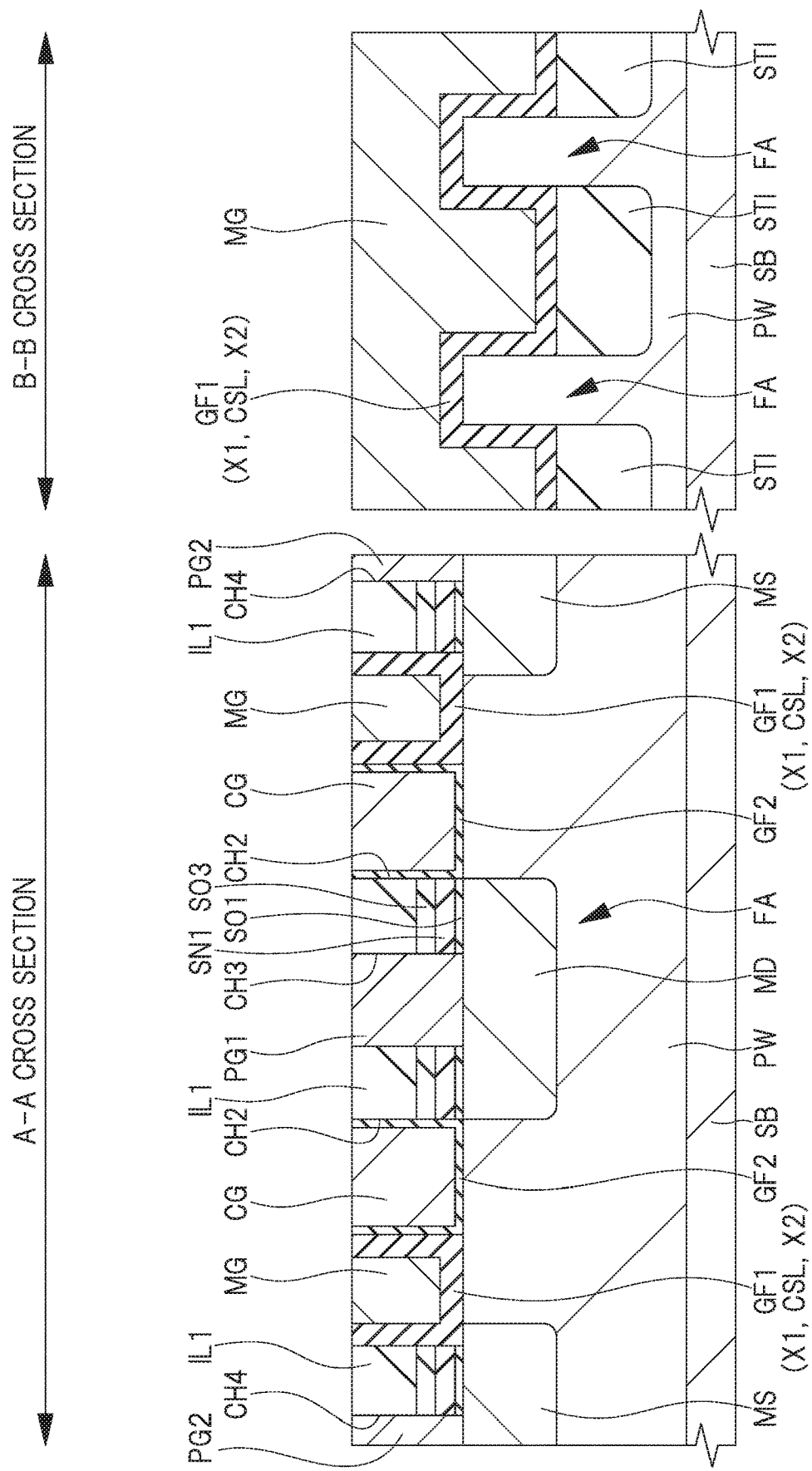
FIG. 27 is a cross-sectional view illustrating a manufacturing process following FIG. 26.

FIG. 27 shows a process of forming the plug PG1 and the plug PG2.

First, a barrier metal film made of, for example, titanium nitride is formed inside the openings CH3, and inside the openings CH4, and on the interlayer insulating film IL1 by, for example, a sputtering method. Next, a conductive film made of, e.g., tungsten is formed on the barrier metal film by, e.g., CVD. Next, the barrier metal film and the conductive film formed on the interlayer insulating film IL1 are removed by the CMP method. As a result, the plug PG1 and the plug PG2 including the barrier metal film and the conductive film are formed in the openings CH3 and the openings CH4, respectively.

In addition, the upper surfaces of the interlayer insulating film IL1, the memory gate electrode MG, the control gate electrode CG, the gate insulating film GF1, and the gate insulating film GF2 are polished by the polishing process by using the CMP method, and the positions of the upper surfaces thereof are lowered.

Following the manufacturing process of FIG. 27, the interlayer insulating film IL2 and the plug PG3 are formed, whereby the semiconductor device shown in FIGS. 3 and 4 is manufactured.

First, an interlayer insulating film IL2 made of, e.g., silicon oxide is formed on the interlayer insulating film IL1, the control gate electrode CG, the memory gate electrode MG, the plug PG1, and the plug PG2 by, e.g., CVD. Next, a contact hole is formed in the interlayer insulating film IL2, and a barrier metal film made of titanium nitride, a conductive film made of tungsten, and the like are filled inside the contact hole, thereby forming a plug PG3. Although not shown here, the plug PG3 is also formed on the control gate electrode CG and the memory gate electrode MG by this step.

First Modified Example

Hereinafter, a semiconductor device of first modified example of the first embodiment will be described with reference to FIGS. 28 to 31. In the following description, differences from the first embodiment will be mainly described.

In the first embodiment, the manufacturing process of the fin FA has been described with reference to FIGS. 7 to 11, but in the first modified example, the other manufacturing process of the fin FA will be described.

FIGS. 28 to 31 correspond to the cross-sectional view taken along the line E-E of FIG. 7, and are also cross-sectional views taken along the direction Y of FIG. 1.

Figure 28:
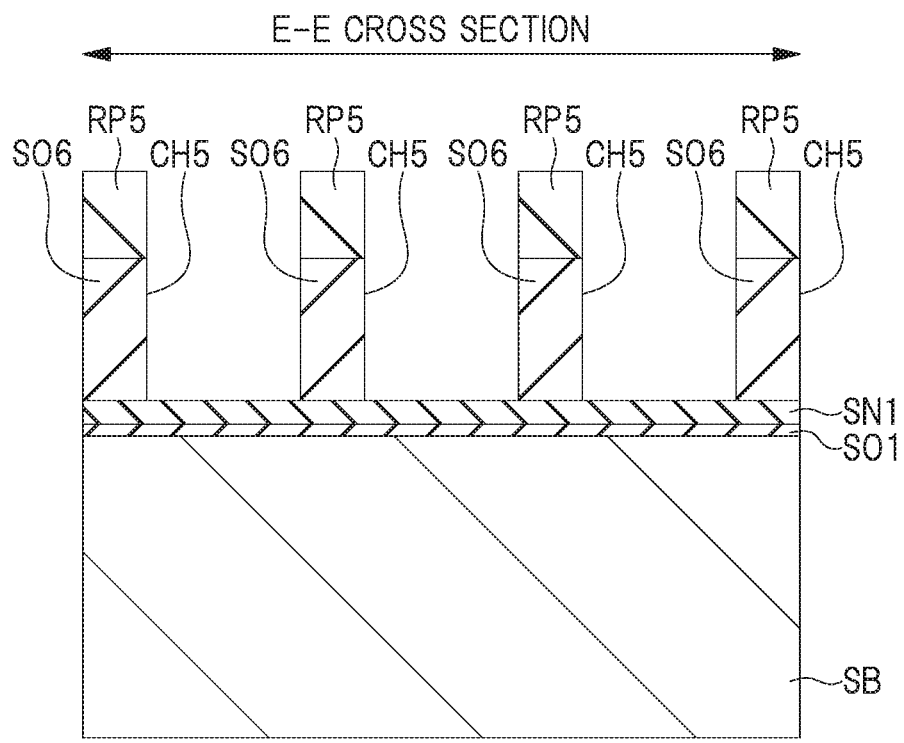
FIG. 28 is a cross-sectional view illustrating a manufacturing process of the semiconductor device of First Modified Example.

First, as shown in FIG. 28, similarly to the first embodiment, a semiconductor substrate SB is prepared, an insulating film SO1 is formed on the semiconductor substrate SB, and an insulating film SN1 is formed on the insulating film SO1. Next, an insulating film SO06 made of, e.g., silicon oxide is formed on the insulating film SN1 by, e.g., CVD. The thickness of the insulating film SO06 is about 20 to 200 nm. Next, a resist pattern RP5 is formed on the insulating film SO6, and dry etching is performed by using the resist pattern RP5 as a mask to remove a part of the insulating film SO6 exposed from the resist pattern RP5. As a result, a plurality of openings CH5 are formed in the insulating film SO6, and a part of the insulating film SN1 is exposed from the insulating film SO6. Thereafter, the resist pattern RP5 is removed by ashing or the like.

Figure 29:
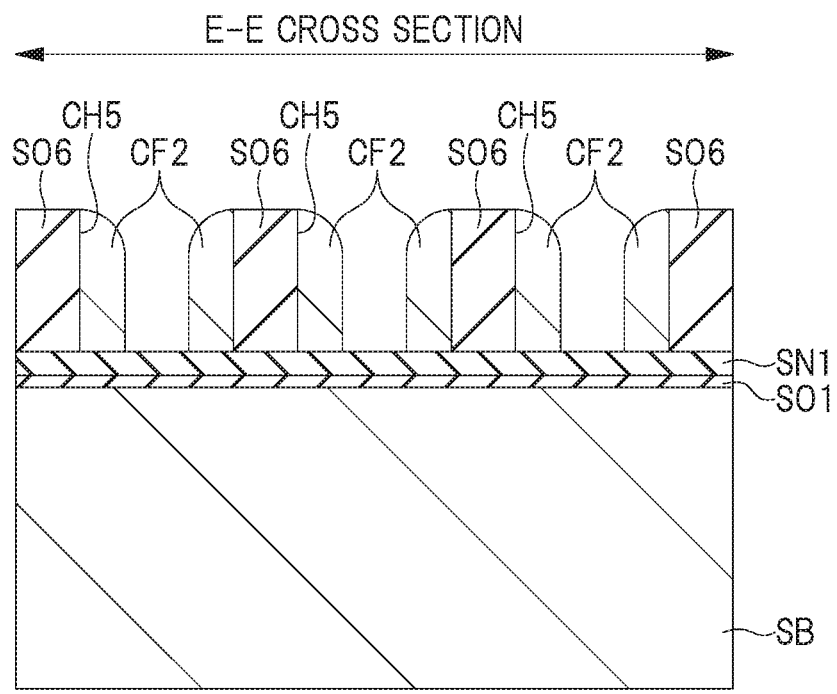
FIG. 29 is a cross-sectional view illustrating a manufacturing process following FIG. 28.

FIG. 29 shows a step of forming the conductive film CF2.

First, a conductive film CF2 made of, for example, amorphous carbon is formed on the upper surface and the side surface of the insulating film SO6 and on the upper surface of the insulating film SN1 exposed at the bottom of the openings CH5 by, for example, CVD. The thickness of the conductive film CF2 is about 20 to 40 nm. Next, anisotropic etching is performed on the conductive film CF2 to leave the conductive film CF2 on the side surface of the insulating film SO6 in the openings CH5. That is, the spacer-shaped conductive film CF2 can be formed on the side surface of the insulating film SO6 in a self-aligned manner.

Figure 30:
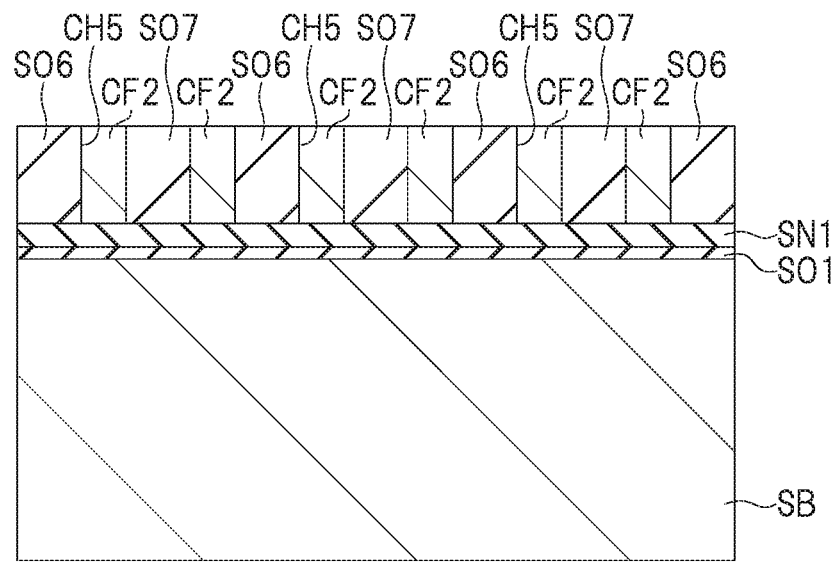
FIG. 30 is a sectional view illustrating a manufacturing process following FIG. 29.

FIG. 30 shows a step of forming the insulating film SO07.

First, an insulating film SO07 made of, for example, silicon oxide is formed by, for example, CVD so as to fill the openings CH5 and cover the insulating film SO6 and the conductive film CF2. Next, by polishing the insulating film SO7 by the CMP method, the conductive film CF2 and the insulating film SO7 are left in the openings CH5, and the insulating film SO7 formed on the upper surface of the insulating film SO6 and on the upper surface of the conductive film CF2 is removed. That is, the conductive film CF2 and the insulating film SO07 are buried in the openings CH5. As described above, the insulating film SO7 can be formed between the two conductive films CF2 in a self-aligned manner. In addition, the upper surfaces of the insulating film SO06, the conductive film CF2, and the insulating film SO07 are slightly removed by this polishing treatment.

Figure 31:
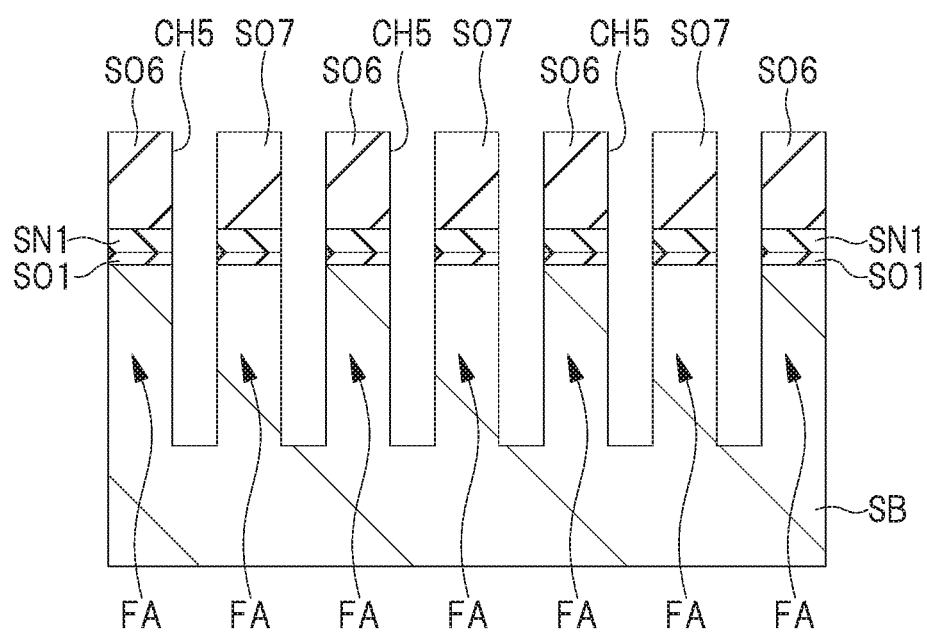
FIG. 31 is a cross-sectional view illustrating a manufacturing process following FIG. 30.

FIG. 31 shows a step of removing the conductive film CF2 and a step of forming the fin FA.

First, anisotropic dry etching is performed by using the insulating films SO6 and SO07 as masks to remove the conductive film CF2. Next, anisotropic dry etching is continued, whereby the insulating film SN1, the insulating film SO01, and a part of the semiconductor substrate SB are sequentially removed. As a result, a fin FA which is a part of the semiconductor substrate SB and protrudes from the semiconductor substrate SB is formed immediately under the insulating films SO6 and SO07.

The subsequent manufacturing process is the same as the manufacturing process from FIG. 12 onward in the first embodiment.

As described above, in the first modified example, the conductive film CF2 is formed on the side surface of the insulating film SO6 in the openings CH5 in a self-aligned manner, and the insulating film SO07 is formed on the side surface of the conductive film CF2 in a self-aligned manner. Therefore, it is difficult for the conductive film CF2 and the insulating film S07 to collapse. In the region where the conductive film CF2 is removed, the fin FA is formed by using the insulating film SO6 and the insulating film SO7 as a mask. Therefore, the fin FA can be stably formed in the same manner as in the first embodiment.

Second Modified Example

Hereinafter, a semiconductor device of second modified example of the first embodiment will be described with reference to FIG. 32. In the following description, differences from the first embodiment will be mainly described.

In the first embodiment, the main part of the memory cell MC is mainly described, but in the second modified example the structure around the end part of the memory cell MC is described.

Figure 32:
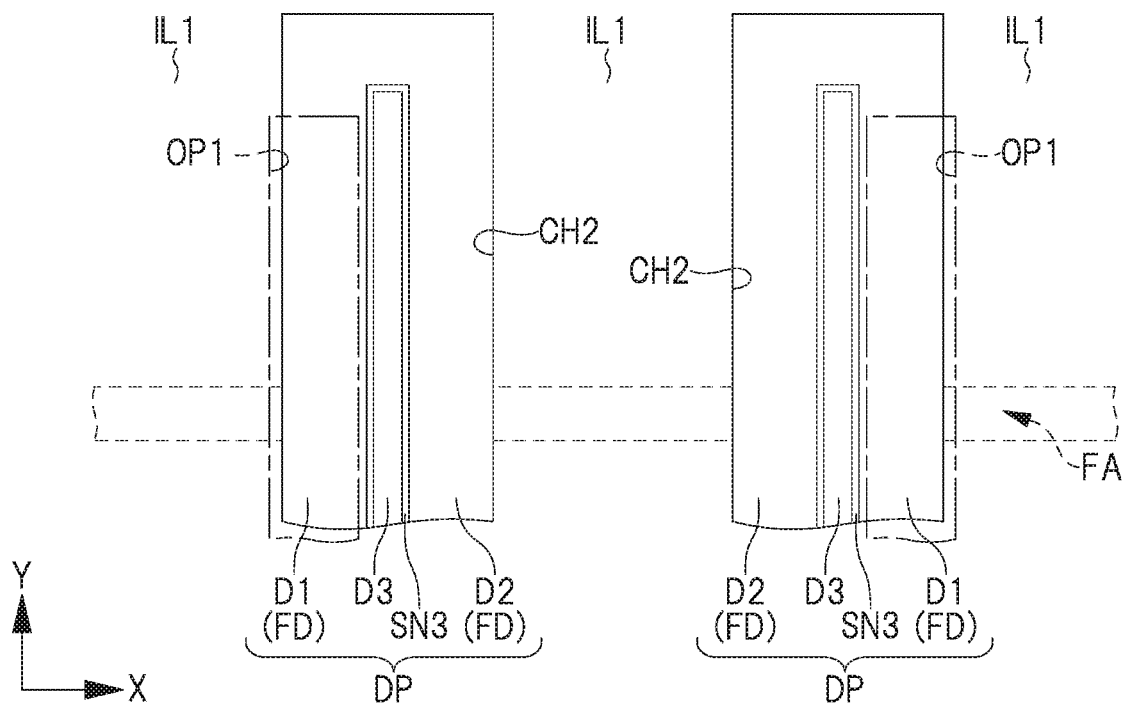
FIG. 32 is a plan view illustrating a manufacturing process of a semiconductor device according to a second modified example.

FIG. 32 is a plan view at the time when the manufacturing process of FIGS. 19 and 20 is completed, and a region indicated by a dashed line is an open region OP1 of the resist pattern RP2 formed in FIG. 21. As described in the first embodiment, the dummy material D1 and the dummy material D2 are formed of the same conductive film FD, and are integrated at the end portion of the memory cell MC.

In the second modified example, as shown in FIG. 32, one end of the opening region OP1 is located on the interlayer insulating film IL1, and the other end of the opening region OP1 is located on the dummy material D1. In this state, when the dry etching process is performed on the dummy material D1, a part of the dummy material D1 is left on the side surface of the insulating film SN3 in the openings CH2, and thereafter, as the isotropic etching process, for example, the wet etching process is performed to remove the remaining dummy material D1. By forming the insulating film SN3 with a film which is difficult to be cut by the isotropic etching process, the dummy material D3 is not cut even if the isotropic etching process is performed by overetching. That is, the dummy material D1 can be removed by performing the isotropic etching process and using the insulating film SN3 between the dummy material D1 and the dummy material D3 as the etching stopper film.

In this manner, the dummy material D1 can be removed even if the opening region OP1 of the resist pattern RP2 does not have the entire opening of the dummy material D1 in the X direction. Therefore, a margin can be provided for the misalignment of the resist pattern RP2.

The technique disclosed in the second modified example can also be applied to the first modified example described above.

Third Modified Example

Hereinafter, a semiconductor device according to a third modified example of the first embodiment will be described with reference to FIG. 33. In the following description, differences from the above-described second modified example will be mainly described.

In the third modified example, the opening region OP2 which is a pattern obtained by changing the opening region OP1 of the second modified example will be described.

Figure 33:
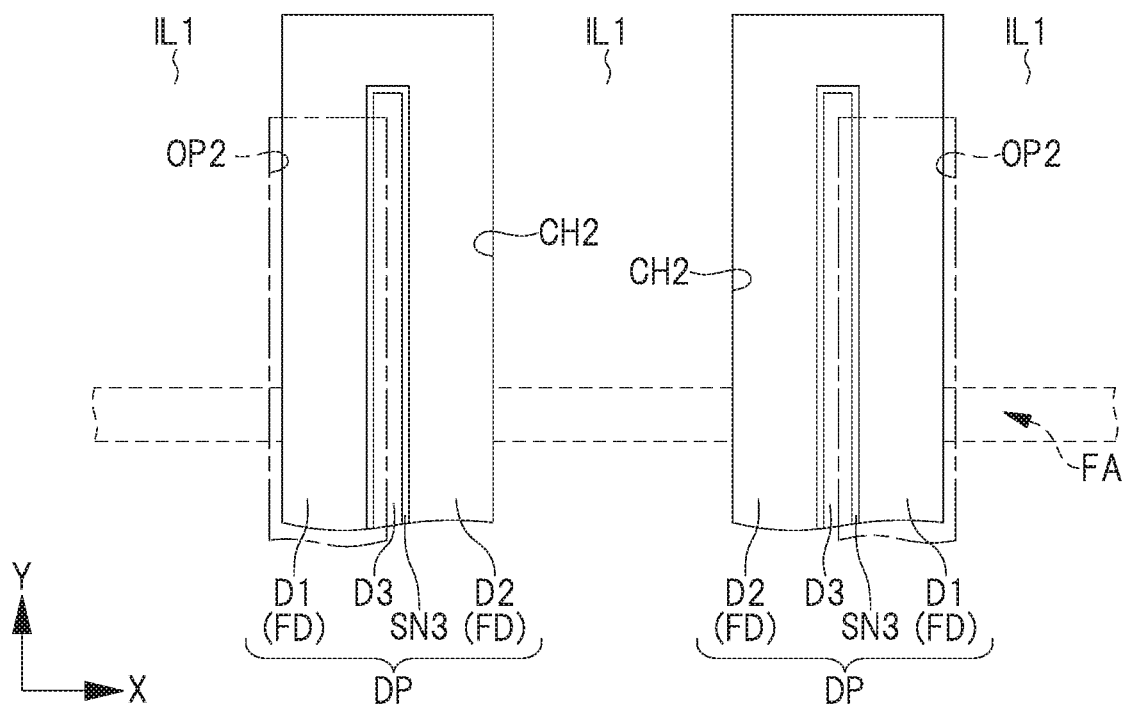
FIG. 33 is a plan view illustrating a manufacturing process of a semiconductor device according to a third modified example.

FIG. 33 is a plan view at the time when the manufacturing process of FIGS. 19 and 20 is completed, and a region indicated by a dashed line is an open region OP2 of the resist pattern RP2 formed in FIG. 21.

In the third modified example, as shown in FIG. 33, one end of the opening region OP2 is located on the interlayer insulating film IL1, and the other end of the opening region OP2 is located on the dummy material D3. By performing dry etching in this state, the dummy material D1 and the dummy material D3 can be removed. Further, since the insulating film SN3 between the dummy material D1 and the dummy material D3 has a small thickness, the insulating film SN3 can also be removed by dry etching of the dummy material D1 and the dummy material D3.

In addition, a part of the dummy material D3 may be left in the dry etching process. Therefore, the remaining dummy material D3 can be removed by performing, for example, a wet etching process as the isotropic etching process. By forming the insulating film SN3 with a film which is difficult to be cut by the isotropic etching process, the dummy material D2 is not cut even if the isotropic etching process is performed by overetching. That is, the dummy material D3 can be removed by performing the isotropic etching process and using the insulating film SN3 between the dummy material D2 and the dummy material D3 as the etching stopper film.

As described above, in either of the first modified example and the second modified example, a margin can be provided for the misalignment of the resist pattern RP2. The opening region OP1 of the first modified example and the opening region OP2 of the second modified example are regions in which the memory gate electrode MG and the gate insulating film GF1 are formed in a later step. Therefore, by applying either the first modified example or the second modified example, it is possible to easily change the design such as the gate length of the memory gate electrode MG.

The technique disclosed in the third modified example can also be applied to the first modified example described above.

Fourth Modified Example

Hereinafter, a semiconductor device of a fourth modified example of the first embodiment will be described with reference to FIGS. 34 and 35. In the following description, differences from the first embodiment will be mainly described.

In a fourth modified example as well, the structure around the end portion of the memory cell MC will be described in the same manner as in the second modified example and the third modified example described above.

Figure 34:
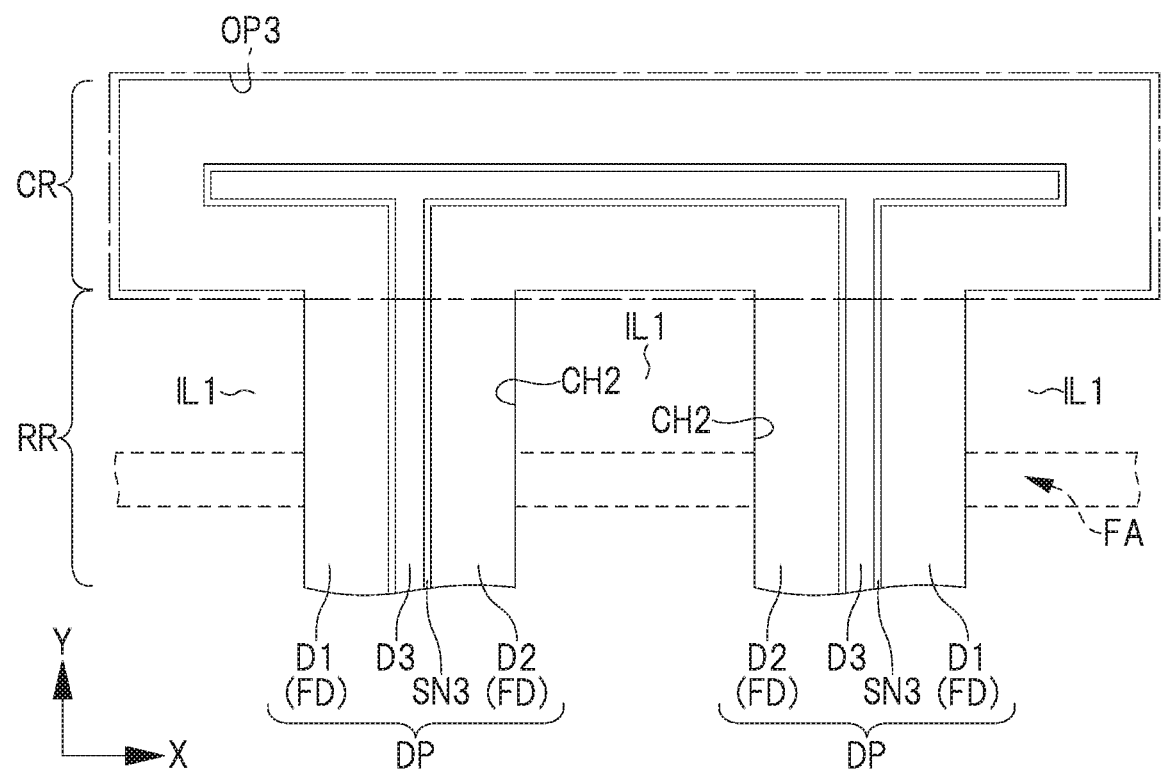
FIG. 34 is a plan view illustrating a manufacturing process of a semiconductor device according to a fourth modified example.
Figure 35:
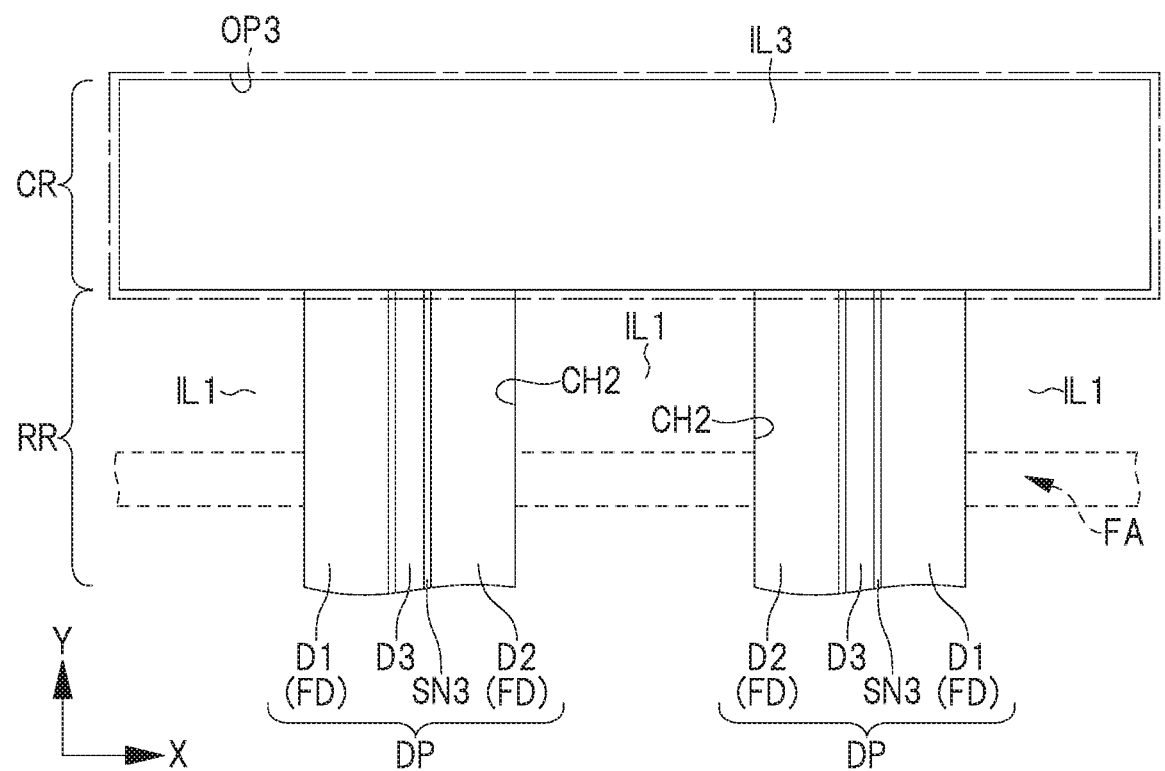
FIG. 35 is a plan view illustrating a manufacturing process following FIG. 34.

FIGS. 34 and 35 are plan views showing a manufacturing process added between FIGS. 20 and 21. The region indicated by the dashed line in FIG. 34 is the opening region OP3 of the resist pattern used in the fourth modified example.

As shown in FIG. 34, the openings CH2 has a plurality of replacement regions RR and connection regions CR. The substitution region RR is the same as the openings CH2 described in the first embodiment, and extends in the Y direction. That is, the replacement region RR is a region in which the dummy pattern DP is removed and replaced with the memory gate electrode MG, the control gate electrode CG, the gate insulating film GF1, and the gate insulating film GF2 in a later step.

The connection region CR is a region that extends in the X direction and connects the plurality of replacement regions RR at the end of the memory cell MC, and is a region that is integrated with the plurality of replacement regions RR. Although the dummy pattern DP is embedded in the connection region CR similarly to the replacement region RR, the dummy pattern DP in the connection region CR is a region which is not replaced by the memory gate electrode MG, the control gate electrode CG, or the like, but is replaced by the interlayer insulating film IL3.

FIG. 35 shows the manufacturing process following FIG. 34.

The dummy pattern DP in the connection region CR shown in FIG. 34 is removed by dry etching and wet etching by using the resist pattern having the opening region OP3 as a mask. Thereafter, the resist pattern is removed by ashing or the like.

Next, an interlayer insulating film IL3 made of, e.g., silicon oxide is formed by, e.g., CVD so as to embed the connection region CR from which the dummy pattern DP has been removed and cover the replacement region RR. Next, the interlayer insulating film IL3 outside the connection region CR is removed by the CMP method, so that the interlayer insulating film IL3 is filled in the connection region CR.

As described above, the interlayer insulating film IL3 is formed in the connection region CR, so that the replacement regions RR are physically separated from each other. That is, in a later step, the memory gate electrode MG and the control gate electrode CG of each memory cell MC can be physically separated.

As in the first embodiment, the memory gate electrode MG and the gate insulating film GF1 may be formed after the control gate electrode CG and the gate insulating film GF2 are formed first. The flash memory performs an operation of collectively writing (or reading) data to (from) a plurality of memory cells MC. At this time, since it is necessary to simultaneously apply the same voltage to a plurality of memory gate electrodes MG, it is desirable to configure the memory gate electrodes MG so as to be connected to other memory gate electrodes MG adjacent to each other at the end portion of the memory cell MC.

When the control gate electrode CG is formed first, in order to connect the plurality of memory gate electrodes MG to each other, the memory gate electrode MG needs to be formed so as to pass over the control gate electrode CG.

Therefore, when patterning the memory gate electrode of the overlying portion, an etching process or the like is performed on the control gate electrode CG. At this time, when the control gate electrode CG is formed first, since the gate insulating film GF1 is formed on the control gate electrode CG, the patterning of the memory gate electrode MG can be performed using the gate insulating film GF1 as an etching stopper.

When the memory gate electrode MG is formed first, it is necessary to pattern the control gate electrode CG on the memory gate electrode MG. At this time, a gate insulating film GF2 is formed on the memory gate electrode MG. Since the thickness of the gate insulating film GF2 is smaller than that of the gate insulating film GF1 having the charge storage layer CSL therein, the reliability of the gate insulating film GF2 as an etching stopper is inferior to that of the gate insulating film GF1. Therefore, when the memory gate electrode MG is formed first, the memory gate electrode MG can be formed more reliably.

The technique disclosed in the fourth modified example can also be applied to the first to third modified example described above.

Fifth Modified Example

Hereinafter, a semiconductor device of the fifth modified example of the first embodiment will be described with reference to FIG. 36. In the following description, differences from the above-described the fourth modified example will be mainly described.

In the fifth modified example, the opening region OP4 which is a pattern obtained by changing the opening region OP3 of the fourth modified example will be described.

Figure 36:
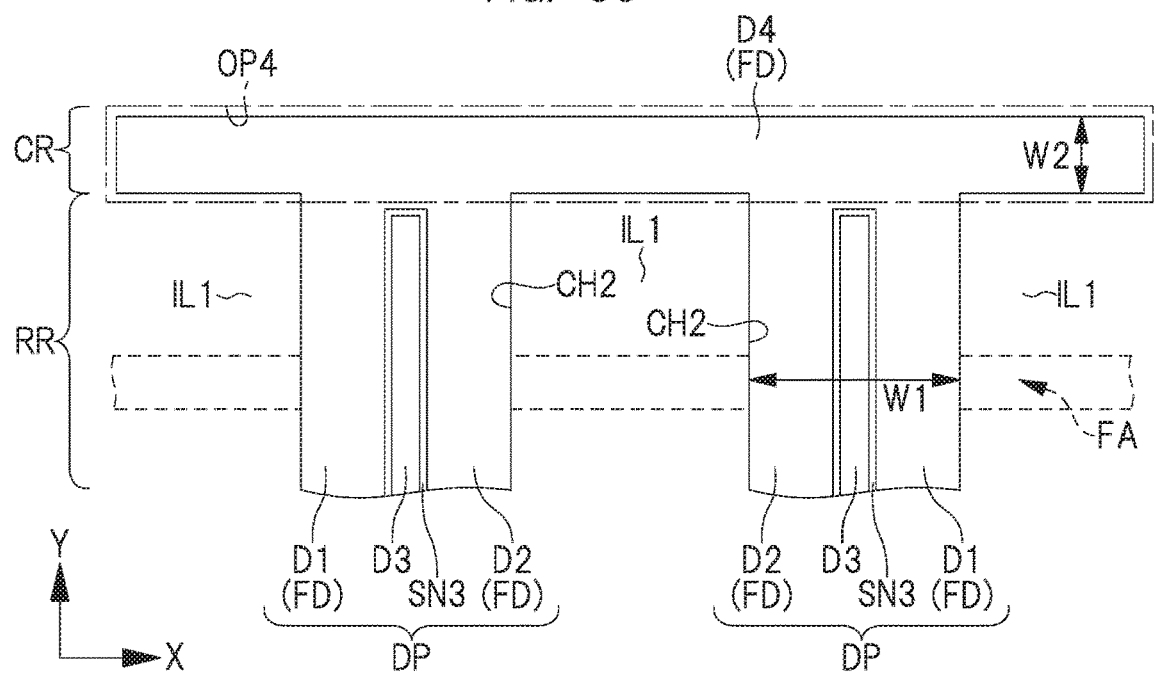
FIG. 36 is a plan view illustrating a manufacturing process of a semiconductor device according to a fifth modified example.

FIG. 36 is a plan view showing a manufacturing process added between FIG. 20 and FIG. 21. The region indicated by the dashed line in FIG. 36 is the opening region OP4 of the resist pattern used in the fifth modified example.

As shown in FIG. 36, similarly to the fourth modified example, the openings CH2 has a plurality of substitution regions RR and connection regions CR, but unlike the fourth modified example, the width of the connection region CR of the fifth modified example is smaller than the width of the connection region CR of the fourth modified example in the Y direction. In FIG. 36, the width of the replacement region RR in the X direction is indicated by W1, and the width of the connection region CR in the Y direction is indicated by W2. Here, the width W2 is smaller than ½ of the width W1.

Therefore, only the dummy material D4 is filled in the connection region CR. The dummy material D4 is a part of the dummy pattern DP, is integrated with the dummy material D1 and the dummy material D2, and is formed of the same conductive film FD as the dummy material D1 and the dummy material D2. That is, since the width of the connection region CR is narrow, the conductive film FD formed in the connection region CR is processed by the anisotropic etching process in the step of FIG. 17, but is left as the dummy material D4 so as to fill the connection region CR. Therefore, in the steps of FIGS. 18 and 19, the insulating film SN3 and the dummy material D3 are not formed in the connection region CR.

Thereafter, the dummy material D4 in the connection region CR is removed, and the interlayer insulating film IL3 is filled in the connection region CR in the same manner as in the fourth modified example.

In the fourth modified example, a dummy material D1, a dummy material D2, a dummy material D3, and an insulating film SN3 constituting the dummy pattern DP are formed in the connection region CR. In contrast, in the fifth modified example, since only the dummy material D4 is formed in the connection region CR, the dummy material D4 can be easily removed by etching.

The technique disclosed in the fifth modified example can also be applied to the first to third modified example described above.

Sixth Modified Example

Hereinafter, a semiconductor device of a sixth modified example of the first embodiment will be described with reference to FIG. 37. In the following description, differences from the first embodiment will be mainly described.

In the sixth modified example, the power supply region MSR of the memory gate electrode MG and the power supply region CSR of the control gate electrode CG will be described as the structure of the end portion of the memory cell MC.

Figure 37:
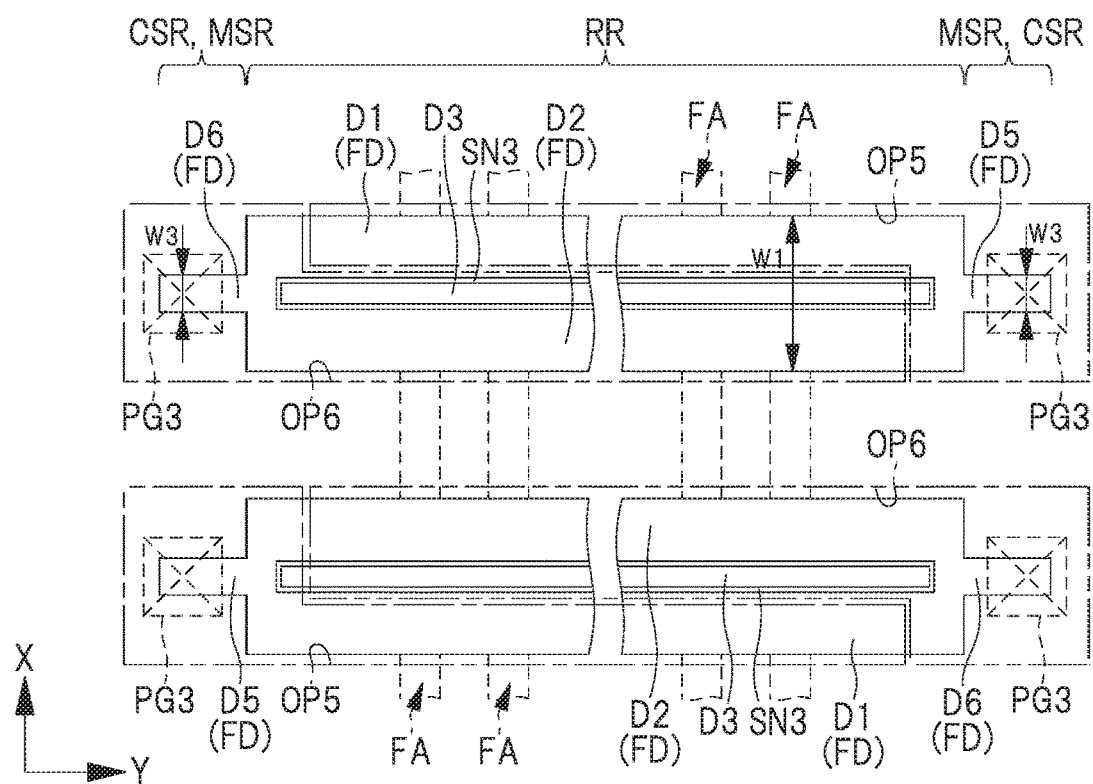
FIG. 37 is a plan view illustrating a manufacturing process of a semiconductor device according to a sixth modified example.

FIG. 37 is a plan view at the time when the manufacturing process of FIGS. 19 and 20 is completed, and a region indicated by a dashed line is an open region OP5 of the resist pattern RP2 formed in FIG. 21. The region indicated by the two-dot chain line is the opening region OP6 of the resist pattern RP3 formed in FIG. 24. In FIG. 37, the plug PG3 connected to the memory gate electrode MG in the power supply region MSR and the plug PG3 connected to the control gate electrode CG in the power supply region CSR are shown by broken lines for convenience.

As shown in FIG. 37, the openings CH2 has a substitution region RR, a power supply region MSR, and a power supply region CSR. The substitution region RR is the same as the openings CH2 described in the first embodiment, and extends in the Y direction. That is, the replacement region RR is a region in which the dummy material D1 which is the dummy patterns DP, the dummy material D2, the dummy material D3, and the insulating film SN3, are removed in a later step, and is a region to be replaced with the memory gate electrode MG, the control gate electrode CG, the gate insulating film GF1, and the gate insulating film GF2.

The power supply region MSR extends in the Y direction at one end portion of the memory cell MC, is integrated with the replacement region RR, and is a region in which the plug PG3 is formed in the memory gate electrode MG in a later step.

The power supply region CSR extends in the Y direction at the other end of the memory cell MC and is integrated with the substitution region RR, and is a region in which a plug PG3 is formed in the control gate electrode CG in a later step.

In the Y direction, the power supply region MSR and the power supply region CSR are formed at opposite ends of the memory cell MC. That is, in the Y direction, the plug PG3 formed in the power supply region MSR is formed on the opposite side of the plurality of fins FA to the plug PG3 formed in the power supply region CSR.

In FIG. 37, the width of the substitution region RR in the X direction is indicated by W1, and the width of the power supply region MSR and the width of the power supply region CSR in the X direction are indicated by W3, respectively. In other words, the width of the openings CH2 on the upper surface of the fin FA served as the main portion of the memory cell MC is W1, and the width of the openings CH2 in the region where the plug PG3 is formed in a later step is W3. Here, the width W3 is smaller than ½ of the width W1.

Therefore, only the dummy material D5 is filled in the power supply region MSR, and only the dummy material D6 is filled in the power supply region CSR. The dummy material D5 and the dummy material D6 are part of the dummy pattern DP, are integrated with the dummy material D1 and the dummy material D2, and are formed of the same conductive film FD as the dummy material D1 and the dummy material D2. That is, since the width W3 of the power supply region MSR and the power supply region CSR is narrow, the conductive film FD formed in the power supply region MSR and the power supply region CSR is processed by the anisotropic etching process in the step of FIG. 17, but is left as the dummy material D5 and the dummy material D6 so as to fill the inside of the power supply region MSR and the inside of the power supply region CSR, respectively. Therefore, in the steps of FIGS. 18 and 19, the insulating film SN3 and the dummy material D3 are not formed in the power supply region MSR and the power supply region CSR. Therefore, since only the dummy material D5 and the dummy material D6 are formed in the power supply region MSR and the power supply region CSR, respectively, it is easy to remove the dummy material D5 and the dummy material D6 by the etching process.

Hereinafter, the manufacturing process of the the sixth modified example will be described with reference to FIGS. 21, 23, 24, and 25 in addition to FIG. 37.

In the step of FIG. 21, the dummy material D1 and the dummy material D5 as the dummy pattern DP are removed in the opening region OP5. In the step of FIG. 23, the memory gate electrode MG and the gate insulating film GF1 are formed in a region where the dummy pattern DP (the dummy material D1 and the dummy material D5) in the opening region OP5 is removed. That is, a part of the replacement region RR and the dummy pattern DP (dummy material D1 and dummy material D5) formed in the power supply region MSR are replaced with the memory gate electrode MG and the gate insulating film GF1.

In addition, in the step of FIG. 24, in the opening region OP6, the dummy material D2, the dummy material D3, the dummy material D6, and the insulating film SN3 which are the dummy patterns DP are removed. In the step of FIG. 25, the control gate electrode CG and the gate insulating film GF2 are formed in a region where the dummy pattern DP (the dummy material D2, the dummy material D3, the dummy material D6, and the insulating film SN3) in the opening region OP6 is removed. That is, the dummy pattern DP (dummy material D2, dummy material D3, dummy material D6, and insulating film SN3) left in the replacement region RR and the power supply region CSR is replaced with the control gate electrode CG and the gate insulating film GF2.

Thereafter, as described in the manufacturing steps of FIGS. 3 and 4, the plug PG3 is formed on the memory gate electrode MG of the power supply region MSR, and the plug PG3 is formed on the control gate electrode CG of the power supply region CSR.

The technique disclosed in the sixth modified example can also be applied to the first to third modified example described above.

Hereinafter, a semiconductor device of the second embodiment will be described with reference to FIGS. 38 and 39. In the following description, differences from the first embodiment will be mainly described.

In the first embodiment, as described with reference to FIG. 16, the diffusion region MD and the diffusion region MS are formed in the fin FA by diffusing the impurity from the insulating film SO3 into which the n-type impurity is introduced, which is formed between the fin FA and the interlayer insulating film IL1, into the fin FA.

In the second embodiment, a diffusion region MD and a diffusion region MS are formed in the fin FA by using another method.

Figure 38:
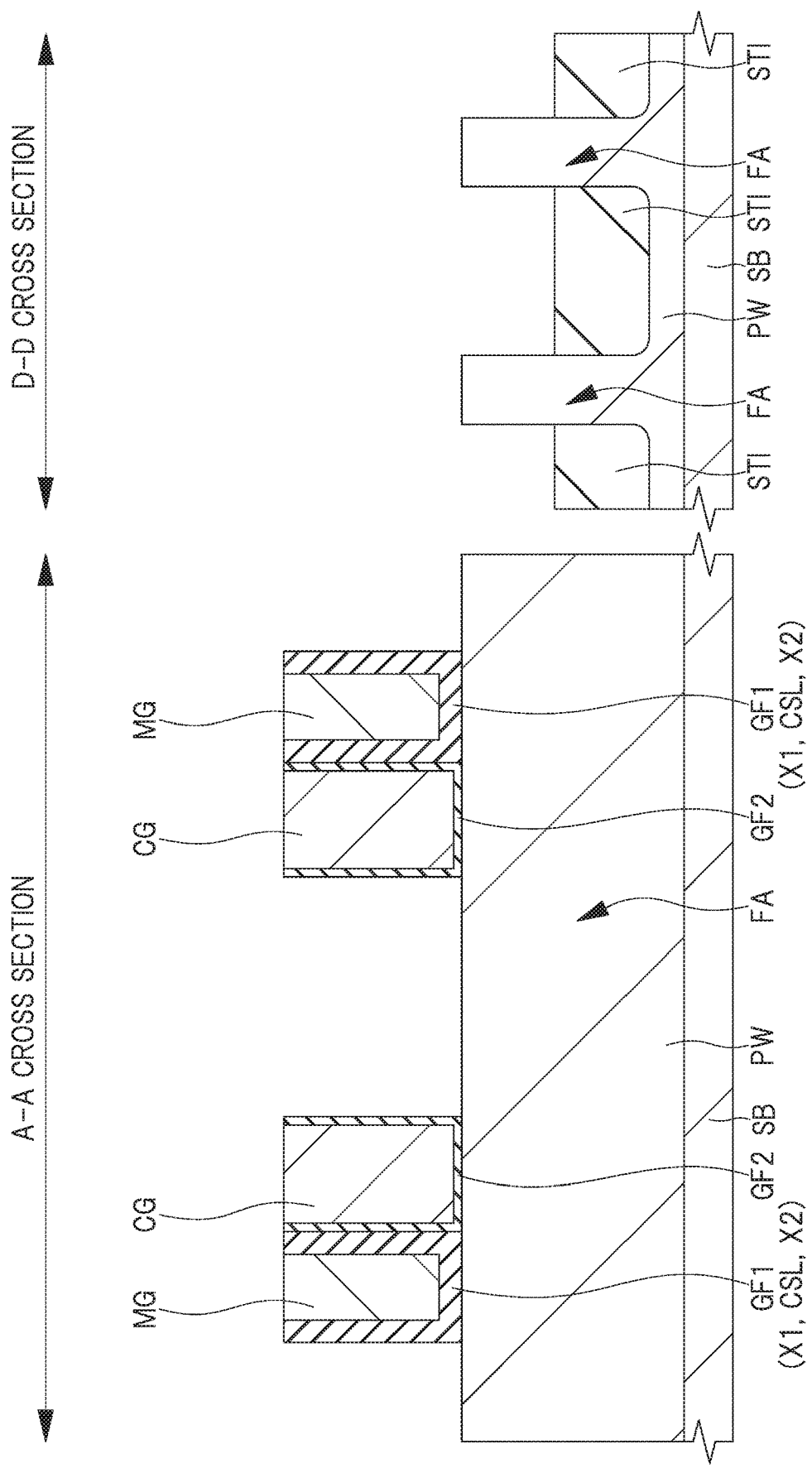
FIG. 38 is a cross-sectional view illustrating a manufacturing process of a semiconductor device according to the second embodiment.
Figure 39:
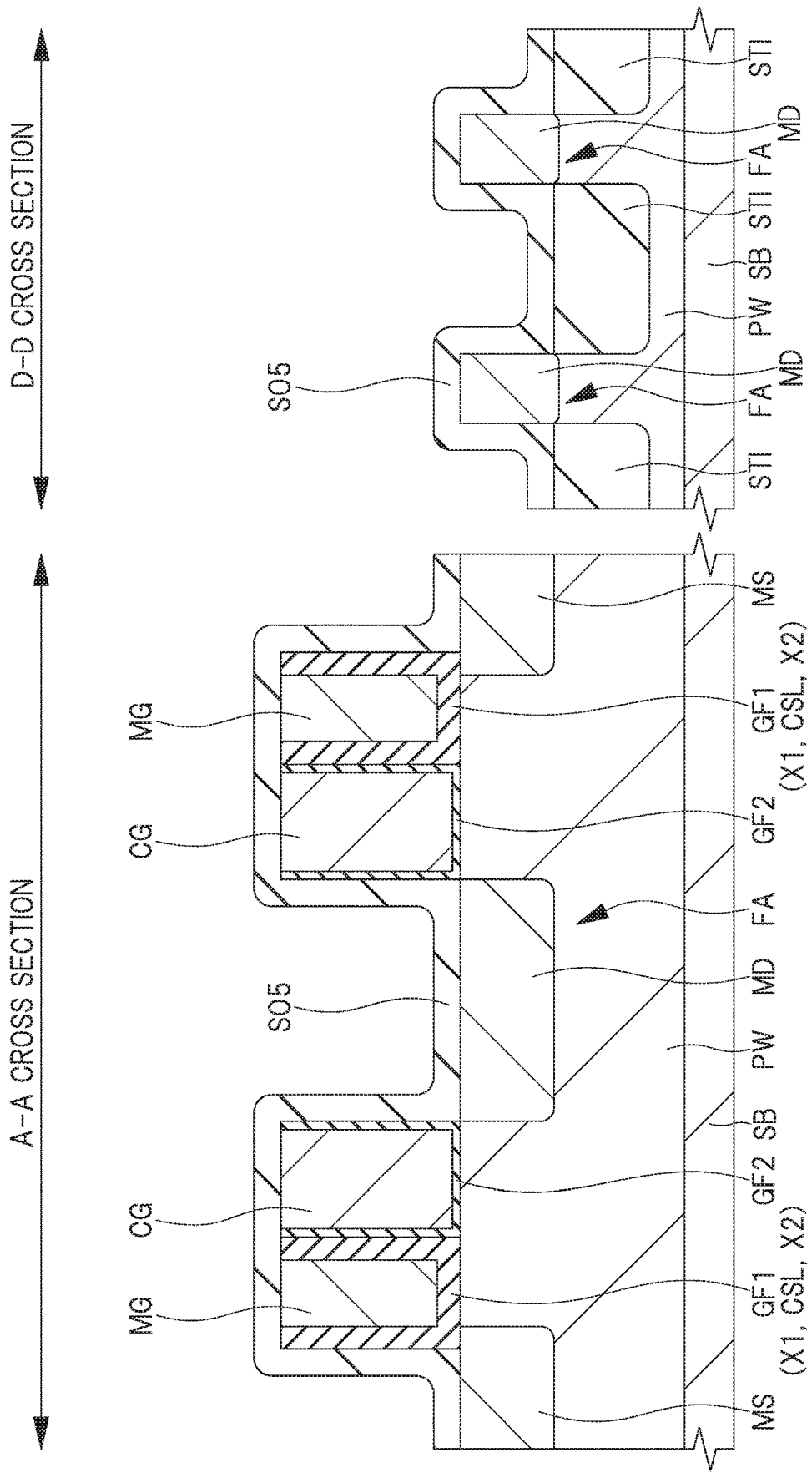
FIG. 39 is a cross-sectional view illustrating a manufacturing process following FIG. 38.

FIGS. 38 and 39 are cross-sectional views taken along line A-A and line D-D shown in FIG. 1. FIG. 38 shows a manufacturing process subsequent to FIG. 25 of the first embodiment. In the second embodiment, it is assumed that the insulating film SO3 is not formed between the fin FA and the interlayer insulating film IL1, and the heat treatment step of FIG. 16 is omitted.

First, as shown in FIG. 38, the interlayer insulating film IL1, the insulating film SN1, and the insulating film SO01 are removed by dry etching and wet etching. As a result, the upper surface and the side surface of the fin FA are exposed in the region where the memory gate electrode MG, the control gate electrode CG, the gate insulating film GF1, and the gate insulating film GF2 are not formed.

Next, as shown in FIG. 39, an insulating film SO05 into which an n-type impurity is introduced is formed by, e.g., CVD so as to be in contact with the fin FA. Next, by performing heat treatment at about 800 to 950° C., the n-type impurity contained in the insulating film SO5 is diffused into the fin FA and activated. A diffusion region MD is formed in the fin FA by the diffused n-type impurity. Although not shown, the diffusion region MS is also formed in the same manner as the diffusion region MD.

Thereafter, for example, a silicon oxide film is formed on the insulating film SO05 by, e.g., CVD, and the silicon oxide film and the insulating film SO5 are polished by CMP to form an insulating film corresponding to the interlayer insulating film IL1 on the diffusion region MD and the diffusion region MS. The subsequent manufacturing steps are the same as those in FIG. 26 and the subsequent steps of the first embodiment.

As described above, in the second embodiment, the diffusion region MD and the diffusion region MS can be formed in the fin FA by a process other than the process of FIG. 16 of the first embodiment.

Further, as in the first embodiment, the diffusion region MD and the diffusion region MS may be formed in the fin FA by the process of FIG. 16 by using the insulating film SO3 into which the n-type impurity is introduced, and further, the diffusion region MD and the diffusion region MS may be made high in concentration by using the method of the second embodiment Such a method is effective when the impurity concentrations of the diffusion region MD and the diffusion region MS formed by the process of FIG. 16 are not sufficient.

The technique disclosed in the second embodiment can also be applied to the above-mentioned first to sixth modified example.

Seventh Modified Example

Hereinafter, a semiconductor device of the seventh modified example will be described with reference to FIG. 40. In the following description, differences from the second embodiment will be mainly described.

In the second embodiment, as described with reference to FIG. 39, the diffusion region MD and the diffusion region MS are formed in the fin FA by diffusing the impurity from the insulating film SO5 into which the n-type impurity is introduced into the fin FA.

In the seventh modified example, a diffusion region MD and a diffusion region MS are formed in the fin FA by an ion implantation method.

Figure 40:
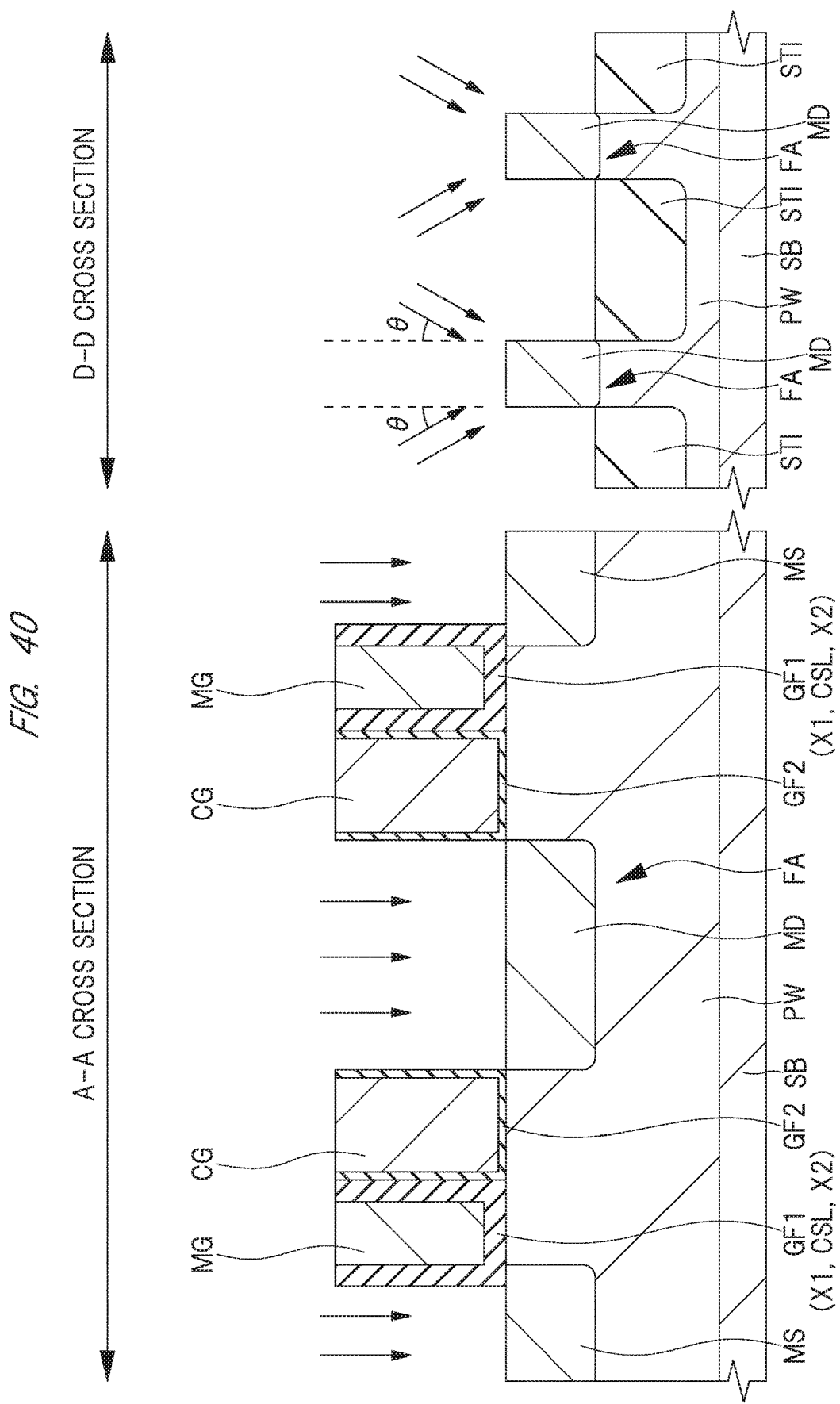
FIG. 40 is a sectional view illustrating a manufacturing process of a semiconductor device according to a seventh modified example.

FIG. 40 is a cross-sectional view taken along line A-A and line D-D shown in FIG. 1, and shows the manufacturing process subsequent to FIG. 38 of the second embodiment.

As shown in FIG. 40, ion implantation is performed on the exposed fin FA to form a diffusion region MD in the fin FA. As shown in the D-D cross section, this ion implantation is performed from a direction inclined at an angle θ of about 10 to 45 degrees from a normal to the semiconductor substrate SB in a direction (Y direction) orthogonal to the extending direction of the fin FA. As a result, since ions are introduced not only from the upper surface of the fin FA but also from the side surface of the fin FA, the diffusion region MD is formed so as to have a relatively uniform impurity concentration in the fin FA. Although not shown, the diffusion region MS is also formed in the same manner as the diffusion region MD. Next, heat treatment is performed at about 700 to 1050° C., whereby impurities contained in the diffusion regions MD and MS are diffused and activated. The subsequent manufacturing process is the same as that of second embodiment.

Further, similarly to the second embodiment, the diffusion region MD and the diffusion region MS may be formed in the fin FA by the process of FIG. 16 using the insulating film SO3 of the first embodiment, and further, the diffusion region MD and the diffusion region MS may be made high in concentration by using the method of the seventh modified example.

Although the invention made by the present inventors has been specifically described based on the embodiment, the present invention is not limited to the embodiment described above, and various modified examples can be made without departing from the gist thereof.

What is claimed is:

1. A method of manufacturing a semiconductor device, comprising the steps of:
 (a) providing a semiconductor substrate;
 (b) forming a first interlayer insulating film on the semiconductor substrate;
 (c) forming a first opening in the first interlayer insulating film;
 (d) forming a dummy pattern inside the first opening;
 (e) removing a part of the dummy pattern;
 (f) after the step (e), filling the first opening from which the part of the dummy pattern is removed with a first gate electrode;
 (g) after the step (f), removing the dummy pattern remained in the first opening in the step (e); and
 (h) filling the first opening from which the dummy pattern is removed in the step (g) with a second gate electrode.

2. The method of manufacturing a semiconductor device according claim 1,
 wherein the step (a) further comprises a step of forming a protrusion which is a part of the semiconductor substrate, and protrudes from an upper surface of the semiconductor substrate by retreating a part of the upper surface of the semiconductor substrate,
 wherein in the step (b), the first interlayer insulating film is formed so as to cover an upper and side surface of the protrusion, and
 wherein in the step (c), the first opening is formed so as to open a part of the upper and side surface of the protrusion.

3. The method of manufacturing a semiconductor device according to claim 2, further comprising a step of forming an element isolation portion over the upper surface of the retreated semiconductor substrate between the step (a) and the step (b),
 wherein a position of the upper surface of the element isolation portion is lower than a position of the upper surface of the protrusion,
 wherein, in a plan view, the first opening, the first gate electrode, and the second electrode extend in a first direction respectively, and
 wherein the first and second gate electrode are formed on the upper and side surface of the protrusion and the element isolation portion.

4. The method of manufacturing a semiconductor device according to claim 2, further comprising a step of forming a first insulating film over the side surface of the protrusion between the step (b) and the step (c),
 wherein in the step (e) and (g), the side surface of the protrusion is protected by the first insulating film.

5. The method of manufacturing a semiconductor device according to claim 2, wherein the step (a) further comprises steps of:
 (a1) forming a first conductive film on the semiconductor substrate,
 (a2) forming a second opening in the first conductive film,
 (a3) inside the second opening, forming a second insulating film on a side surface of the first conductive film,
 (a4) after the step (a3), removing the first conductive film, and
 (a5) after the step (a4), forming the protrusion by echoing the semiconductor substrate by using the second insulating film as a mask.

6. The method of manufacturing a semiconductor device according to claim 2, wherein the step (a) further comprises steps of:
 (a6) forming a third insulating film on the semiconductor substrate,
 (a7) forming a third opening in the third insulating film,
 (a8) forming a second conductive film on a side surface of the third insulating film in the third opening,
 (a9) forming a fourth insulating film on the third insulating film and the second conductive film so as to fill the third opening,
 (a10) removing the fourth insulating film formed on the third insulating and the second conductive film so as to remain the second conductive film and the fourth insulating film formed in the third opening,
 (a11) after the step (a10), removing the second conductive film, and
 (a12) after the step (a11), forming the protrusion by echoing the semiconductor substrate by using the third and fourth insulating film as a mask.

7. The method of manufacturing a semiconductor device according to claim 1, further comprising steps of:
 between the step (e) and step (f), forming a first gate insulating film inside the first opening from which the part of the dummy pattern is removed; and
 between the step (g) and step (h), forming a second gate insulating film inside the first opening from which the dummy pattern is removed in the step (g),
 wherein, in the step (f), the first gate electrode is filled in the first opening via the first gate insulating film, and
 wherein, in the step (g), the second gate electrode is filled in the first opening via the second gate insulating film.

8. The method of manufacturing a semiconductor device according to claim 1,
 wherein, in the step (b), forming the first interlayer insulating film on the semiconductor substrate via the fourth insulating film into which an impurity having a first conductivity type is introduced, wherein, in the step (c), forming the first opening on the first interlayer insulating film and the fourth insulating film, and wherein, between the step (c) and the step (d), forming a first diffusion region on the semiconductor substrate by diffusing the impurity having the first conductivity from the fourth insulating film to the semiconductor substrate by performing heat treatment.

9. The method of manufacturing a semiconductor device according to claim 1, wherein the step (d) further comprises steps of:

(d1) inside the first opening, forming a first dummy material on a first side surface of the first interlayer insulating film, and forming a second dummy material on a second side surface of the first interlayer insulating film, the second side surface being opposite to the first side surface, and (d2) inside the first opening, by forming a third dummy material between the first dummy material and the second dummy material via a fifth insulating film, filling the first opening with the dummy pattern including the first dummy material, the second dummy material, the third dummy material, and the fifth insulating film.

10. The method of manufacturing a semiconductor device according to claim 9, wherein the step (d1) further comprises steps of:

(d11) forming a third conductive film inside the first opening, and (d12) forming the first and second dummy material being comprised of the third conductive film by an anisotropic etching process with the third conductive film.

11. The method of manufacturing a semiconductor device according to claim 9, wherein in the step (e), the first dummy material is removed by an isotropic etching process by using the fifth insulating film between the first dummy material and the third dummy material as an etching stopper film, and wherein in the step (g), the second dummy material, the third dummy material, and the fifth insulating film are removed.

12. The method of manufacturing a semiconductor device according to claim 9, wherein in the step (e), the first and third dummy material are removed by an etching process on the fifth insulating film between the second dummy material and the third dummy material as an etching stopper film, and wherein, in the step (g), the second dummy material and the fifth insulating film are removed.

13. The method of manufacturing a semiconductor device according to claim 9, wherein the first opening comprises a plurality of replacement regions extending in a first direction, and a connection region extending in a second direction orthogonal to the first direction and connecting the plurality of replacement regions, wherein in the step (d1), the first and second dummy material are formed in the plurality of the replacement regions, and a fourth dummy material integrated with the first dummy material and the second dummy material is formed in the connection region, wherein in the step (d2), the third dummy material and the fifth insulating film are formed in the plurality of replacement regions and are not formed in the connection region, wherein, between the step (d) and the step (e), further removing the fourth dummy material formed in the connection region, and filling the connection region from which the fourth dummy material is removed with a second interlayer insulating film.

14. The method of manufacturing a semiconductor device according to claim 1, wherein in a plan view, the first opening comprises a plurality of replacement regions extending in a first direction, and a connection region extending in a second direction orthogonal to the first direction and connecting the plurality of replacement regions, wherein in the step (d), the dummy pattern is formed in the plurality of the replacement regions and the connection region, and wherein between the step (d) and the step (e), further removing the dummy pattern formed in the connection region, and filling the connection region from which the dummy pattern is removed with a third interlayer insulating film.

15. The method of manufacturing a semiconductor device according to claim 1, wherein, in a plan view, the first opening has a replacement region extending in a first direction, and a first and second power supply region extending in the first direction and connecting to the replacement region, wherein in the step (d), the dummy pattern is formed in the replacement region, the first power supply region, and the second power supply region, wherein in the step (e), the dummy pattern in a part of the replacement region and in the first power supply region is removed, wherein in the step (f), the first gate electrode is formed in the part of the replacement region and in the first power supply region is removed, wherein in the step (g), the dummy pattern remained in the replacement region and the second power supply region in the step (e) is removed, wherein in the step (h), the second gate electrode is formed in the replacement region and in the second power supply region where the dummy pattern is removed, and wherein, in a second direction orthogonal to the first direction in a plan view, each of a width of the first and second power supply region is smaller than ½ of a width of the replacement region.

16. The method of manufacturing a semiconductor device according to claim 1, further comprising steps of:

(i) after the step (h), removing the first interlayer insulating film;

(j) forming a sixth insulating film in which an impurity having a first conductivity type is introduced so as to be contact with the semiconductor substrate in a region from which the first interlayer insulating film is removed; and (k) forming a second diffusion region on the semiconductor substrate by diffusing the impurity having the first conductivity from the sixth insulating film to the semiconductor substrate by performing heat treatment.

17. The method of manufacturing a semiconductor device according to claim 1, further comprising steps of:

(l) after the step (h), removing the first interlayer insulating film; and (m) forming a third diffusion region having the first conductive type in the semiconductor substrate by using an ion implantation method in the region where the first interlayer insulating film is removed.

* * * * *